(12) United States Patent
Di Vincenzo

(10) Patent No.: US 10,607,676 B2
(45) Date of Patent: Mar. 31, 2020

(54) SENSING A MEMORY CELL

(71) Applicant: Micron Technology, Inc., Boise, ID (US)

(72) Inventor: Umberto Di Vincenzo, Capriate San Gervasio (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/962,941

(22) Filed: Apr. 25, 2018

(65) Prior Publication Data

US 2019/0333563 A1     Oct. 31, 2019

(51) Int. Cl.
*G11C 11/22*     (2006.01)
*G11C 11/24*     (2006.01)

(52) U.S. Cl.
CPC .......... *G11C 11/2273* (2013.01); *G11C 11/22* (2013.01); *G11C 11/221* (2013.01); *G11C 11/2255* (2013.01); *G11C 11/2257* (2013.01); *G11C 11/24* (2013.01); *G11C 11/2275* (2013.01); *G11C 11/2293* (2013.01)

(58) Field of Classification Search
CPC ..... G11C 11/22; G11C 11/2273; G11C 11/24; G11C 11/2255
See application file for complete search history.

(56) References Cited

U.S. PATENT DOCUMENTS

| | | | | |
|---|---|---|---|---|
| 6,031,754 A * | 2/2000 | Derbenwick | ........... | G11C 11/22 365/145 |
| 6,118,688 A * | 9/2000 | Hirano | .................... | G11C 11/22 365/145 |
| 6,487,104 B2 * | 11/2002 | Takashima | .............. | G11C 11/22 365/145 |
| 6,594,174 B2 * | 7/2003 | Choi | ........................ | G11C 11/22 365/145 |
| 7,016,216 B2 * | 3/2006 | Oikawa | .................... | G11C 11/22 365/145 |
| 8,228,707 B2 * | 7/2012 | Nishimura | .............. | G11C 11/22 365/145 |
| 2010/0046306 A1 | 2/2010 | Takahashi | | |
| 2010/0128545 A1 | 5/2010 | Lee et al. | | |

(Continued)

OTHER PUBLICATIONS

ISA/KR, International Search Report and Written Opinion of the International Searching Authority, Int'l Appl. No. PCT/US2019/025379, dated Jul. 19, 2019, Korean Intellectual Property Office, Seo-gu, Daejeon, Republic of Korea, 9 pgs.

*Primary Examiner* — Vanthu T Nguyen
(74) *Attorney, Agent, or Firm* — Holland & Hart LLP

(57) ABSTRACT

Devices and methods for sensing a memory cell are described. The memory cell may include a ferroelectric memory cell. During a read operation, a cascode may couple a precharged capacitor with the memory cell to transfer a charge between the precharged capacitor and the memory cell. The cascode may isolate the capacitor from the memory cell based on the charge transferred between the capacitor and the memory cell. A second capacitor (e.g., a parasitic capacitor) may continue to provide an additional amount of charge to the memory cell during the read operation. Such a change in capacitance value during the read operation may provide a large sense window due to a non-linear voltage characteristics associated with the change in capacitance value.

23 Claims, 9 Drawing Sheets

(56) References Cited

U.S. PATENT DOCUMENTS

2012/0281470 A1 11/2012 Fukuda
2017/0117025 A1 4/2017 Lee
2017/0316833 A1 11/2017 Ihm et al.

* cited by examiner

SENSING A MEMORY CELL

BACKGROUND

The following relates generally to operating a memory array and more specifically to sensing a memory cell.

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source. FeRAM may use similar device architectures as volatile memory but may have non-volatile properties due to the use of a ferroelectric capacitor as a storage device. FeRAM devices may thus have improved performance compared to other non-volatile and volatile memory devices.

Improving memory devices, generally, may include increasing the memory cell density, increasing read/write speeds, increasing reliability, increasing data retention, reducing power consumption, or reducing manufacturing costs, among other metrics. Providing a large sense window during a read operation to determine a logic state stored on a memory cell may also be desired.

DETAILED DESCRIPTION

Figure 1:
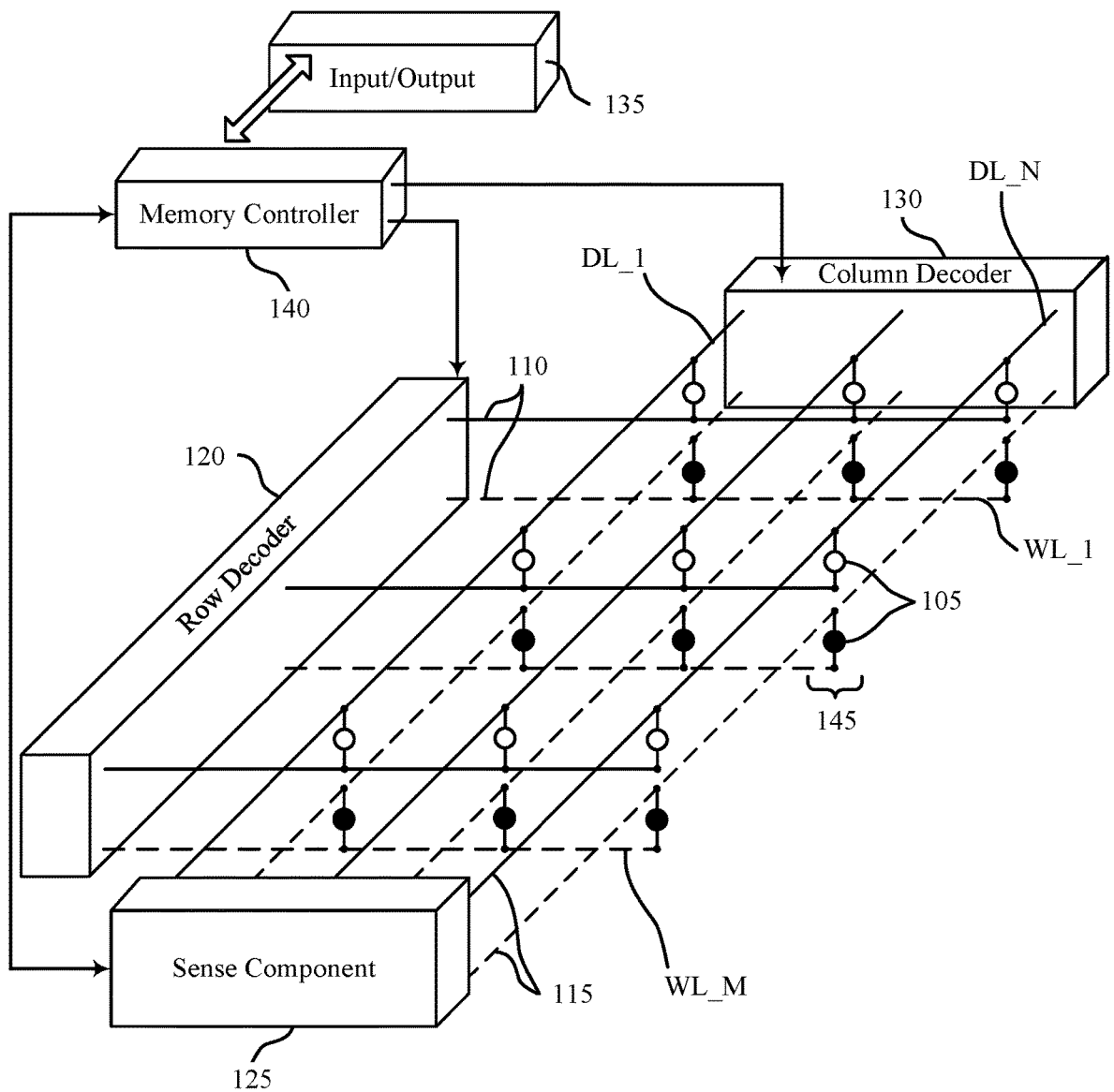
FIG. 1 illustrates an example of a memory array that supports sensing a memory cell in accordance with aspects of the present disclosure.

In some memory devices, an amount of charge exchanged by a memory cell with other components during a read operation may be used to determine whether the memory cell stores a first logic state or a second logic state. A difference in an amount of charge (Q) needed by a memory cell during the read operation based on a logic state stored on the memory cell may influence a sense window of the memory cell. For example, the sense window during the read operation may be based on a difference in the amount of charge to detect a first logic state and a second logic state. In some memory devices, the change in a voltage associated with the charge during the read operation may be linear or nearly linear. In other memory devices, however, characteristics of the memory devices may be configured such that the change in the voltage associated with the charge during the read operation may be non-linear during the read operation. Such a change may increase the size of the sense window and may improve the read operation generally.

A memory device that includes a circuit (e.g., a precharge circuit) configured to provide non-linear voltage characteristics during a read operation and methods for using the circuit for sensing a memory cell are described herein. The circuit, for example a precharge circuit, may include a capacitor and a switching component. The capacitor of the precharge circuit may supply a charge associated with the memory cell during a first portion of the read operation. In addition, a switching component of the precharge circuit may be configured to selectively couple and/or isolate the capacitor from the memory cell during the read operation. After the capacitor is isolated from the memory cell (e.g., using the switching component), an additional charge may be transferred from a parasitic capacitor to the memory cell during a second portion of the read operation based on what logic state is stored on the memory cell. The capacitance value of capacitor may be configured to be different (e.g., greater) from the capacitance value of the parasitic capacitor. Such a difference in capacitance values between the first portion and the second portion of the read operation may produce the non-linear voltage characteristics that may advantageously provide a large sense window during the read operation.

The rate of change of the voltage seen at a node may be inversely proportional to the capacitance value associated with that node. As such, the capacitor of the circuit and/or the capacitance value of the capacitor may be configured based on a desired first rate of change of the voltage of the node during the first portion of read operation (e.g., the first portion during which the capacitor supplies at least some portion of the charge that the memory cell should have). In addition, the voltage value at which the capacitor is precharged to (e.g., Vref) may be determined to provide a large sense window.

During a read operation, the capacitor may be isolated from the node by deactivating the switching component. Depending on the logic state stored on the memory cell, the voltage of the node may vary as a result of supplying the charge that the memory cell should have during the read operation—e.g., during the second portion of read operation. In some cases, a second capacitor at the node (e.g., a parasitic capacitance associated with the node) may transfer additional charge to the memory cell after the capacitor is isolated from the memory cell. A rate of change in the voltage of the node (e.g., a second rate of change of the voltage of the node), however, may be different during the second portion of the read operation because the capacitor has been disconnected from the node. In some cases, the second rate of change may be different than (e.g., greater than) the first rate of change to facilitate a large sense window. Such a change in the rate of change of the voltage of the node may produce a larger difference between voltages at the node based on the logic state stored on the memory cell, which in turn may provide a large sense window during the read operation.

Operation of the circuit as described above may provide a large sense window during a read operation. Furthermore, the sense window may be adjusted based on various parameters associated with the precharge circuit—e.g., a value of a voltage applied to the switching component, a threshold voltage of the switching component, Vref, the capacitance value of the capacitor, or a combination thereof.

Features of the disclosure introduced above are further described below in the context of FIGS. 1 through 3. Specific examples are then described for FIGS. 4 through 6. These and other features of the disclosure are further illustrated by and described with reference to apparatus diagrams, system diagrams, and flowcharts that relate to sensing a memory cell (e.g., FIGS. 7-9).

FIG. 1 illustrates an example of a memory array 100 that supports sensing a memory cell in accordance with aspects of the present disclosure. FIG. 1 is an illustrative schematic representation of various components and features of the memory array 100. As such, it should be appreciated that the components and feature of the memory array 100 are shown to illustrate functional interrelationships, not their actual physical positions within the memory array 100. Memory array 100 may also be referred to as an electronic memory apparatus or device. Memory array 100 includes memory cells 105 that are programmable to store different states. In some cases, each memory cell 105 may be a ferroelectric memory cell that may include a capacitor with a ferroelectric material as the insulating material. In some cases, the capacitor may be referred to as a ferroelectric container. Each memory cell 105 may be programmable to store two states, denoted as a logic 0 and a logic 1. Each memory cell 105 may be stacked on top of each other resulting in two-decks of memory cell 145. Hence, the example in FIG. 1 may be an example that depicts two decks of memory array.

In some cases, memory cells 105 are configured to store more than two logic states. A memory cell 105 may store a charge representative of the programmable states in a capacitor; for example, a charged and uncharged capacitor may represent two logic states, respectively. A charge may represent an amount of charge present in or on a component or a conductor. In some cases, a charge may correspond to a logic state stored in a capacitor of a memory cell 105. In some cases, a charge may correspond to some other value and/or component. As used herein, a charge is not limited to a particular value carried by a single proton or electron. DRAM architectures may commonly use such a design, and the capacitor employed may include a dielectric material with paraelectric or linear polarization properties as the insulator. By contrast, a ferroelectric memory cell may include a capacitor with a ferroelectric material as the insulating material. Different levels of charge of a ferroelectric capacitor may represent different logic states. Ferroelectric materials have non-linear polarization properties; some details and advantages of a ferroelectric memory cell 105 are discussed below.

Operations such as reading and writing, which may be referred to as access operations, may be performed on memory cells 105 by activating or selecting word line 110 and digit line 115. Word lines 110 may also be known as row lines, sense lines, and access lines. Digit lines 115 may also be known as bit lines, column lines, access lines. References to word lines and digit lines, or their analogues, are interchangeable without loss of understanding or operation. Word lines 110 and digit lines 115 may be perpendicular (or nearly perpendicular) to one another to create an array. Depending on the type of memory cell (e.g., FeRAM, RRAM), other access lines may be present, such as plate lines, for example. It should be appreciated that the exact operation of the memory device may be altered based on the type of memory cell and/or the specific access lines used in the memory device.

Activating or selecting a word line 110 or a digit line 115 may include applying a voltage to the respective line. Word lines 110 and digit lines 115 may be made of conductive materials such as metals (e.g., copper (Cu), aluminum (Al), gold (Au), tungsten (W)), metal alloys, carbon, conductively-doped semiconductors, or other conductive materials, alloys, compounds, or the like.

Memory array 100 may be a two-dimensional (2D) memory array or a three-dimensional (3D) memory array. A 3D memory array may include 2D memory arrays formed on top of one another. This may increase the number of memory cells that may be placed or created on a single die or substrate as compared with 2D arrays, which in turn may reduce production costs or increase the performance of the memory array, or both. Memory array 100 may include any number of levels. Each level may be aligned or positioned so that memory cells 105 may be approximately aligned with one another across each level. Each row of memory cells 105 may be connected to a single word line 110, and each column of memory cells 105 is connected to a single digit line 115. By activating one word line 110 and one digit line 115 (e.g., applying a voltage to the word line 110 or digit line 115), a single memory cell 105 may be accessed at their intersection. Accessing the memory cell 105 may include reading or writing the memory cell 105. The intersection of a word line 110 and digit line 115 may be referred to as an address of a memory cell.

In some architectures, the logic storing device of a cell, e.g., a capacitor, may be electrically isolated from the digit line by a selector device. The word line 110 may be connected to and may control the selector device. For example, the selector device may be a transistor (e.g., thin-film transistor (TFT)) and the word line 110 may be connected to the gate of the transistor. Activating the word line 110 results in an electrical connection or closed circuit between the capacitor of a memory cell 105 and its corresponding digit line 115. The digit line may then be accessed to either read or write the memory cell 105. In addition, as described below in FIG. 2, access operation of ferroelectric memory cells may need an additional connection to a node of the ferroelectric memory cell, namely cell plate node via plate line. In some cases, a digit line 115 may be precharged to a first voltage during a read operation. In some cases, a capacitor may also be precharged to a second voltage, and the capacitor may be configured to integrate a charge associated with a memory cell during the read operation. In some cases, the charge may be transferred between the memory cell and the capacitor through a first cascode and a second cascode during the read operation, the first cascode being coupled with the memory cell and a sense component, and the second cascode being coupled with the capacitor and the sense component. In some cases, a logic state stored on the memory cell 105 may be determined based on the charge transferred through the first cascode.

Accessing the memory cells 105 may be controlled through a row decoder 120 and a column decoder 130. For example, a row decoder 120 may receive a row address from the memory controller 140 and activate the appropriate word line 110 based on the received row address. Similarly, a column decoder 130 receives a column address from the memory controller 140 and activates the appropriate digit line 115. For example, memory array 100 may include multiple word lines 110, labeled WL_1 through WL_M, and multiple digit lines 115, labeled DL_1 through DL_N, where M and N depend on the array size. Thus, by activating a word line 110 and a digit line 115, e.g., WL_2 and DL_3, the memory cell 105 at their intersection may be accessed. In addition, access operation of ferroelectric memory cells may need to activate a corresponding plate line for the memory cell 105, associated with plate line decoder.

Upon accessing, a memory cell 105 may be read, or sensed, by sense component 125 to determine the stored state of the memory cell 105. For example, after accessing the memory cell 105, the ferroelectric capacitor of memory cell 105 may discharge onto its corresponding digit line 115. Discharging the ferroelectric capacitor may result from biasing, or applying a voltage, to the ferroelectric capacitor. The discharging may cause a change in the voltage of the digit line 115, which sense component 125 may compare to a reference voltage in order to determine the stored state of the memory cell 105. For example, if digit line 115 has a higher voltage than the reference voltage, then sense component 125 may determine that the stored state in memory cell 105 was a logic 1 and vice versa. Sense component 125 may include various transistors or amplifiers in order to detect and amplify a difference in the signals, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120.

A memory cell 105 may be set, or written, by similarly activating the relevant word line 110 and digit line 115—i.e., a logic value may be stored in the memory cell 105. Column decoder 130 or row decoder 120 may accept data, for example input/output 135, to be written to the memory cells 105. A ferroelectric memory cell 105 may be written by applying a voltage across the ferroelectric capacitor. This process is discussed in more detail below.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So the logic state may be re-written after a sense operation. Additionally, activating a single word line 110 may result in the discharge of all memory cells in the row; thus, several or all memory cells 105 in the row may need to be re-written.

In some memory architectures, including DRAM, memory cells may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM arrays, which may result in significant power consumption. With increasingly larger memory arrays, increased power consumption may inhibit the deployment or operation of memory arrays (e.g., power supplies, heat generation, material limits), especially for mobile devices that rely on a finite power source, such as a battery. As discussed below, ferroelectric memory cells 105 may have beneficial properties that may result in improved performance relative to other memory architectures.

The memory controller 140 may control the operation (e.g., read, write, re-write, refresh, discharge) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to activate the desired word line 110 and digit line 115. Memory controller 140 may also generate and control various voltages or currents used during the operation of memory array 100. For example, it may apply discharge voltages to a word line 110 or digit line 115 after accessing one or more memory cells 105.

The memory controller 140 may control various phases of a read operation. The memory controller 140 may control timings associated with precharging a selected digit line 115 to a first voltage. In some cases, the memory controller 140 may control timings associated with precharging a capacitor to a second voltage, where the capacitor is configured to integrate a charge associated with the memory cell 105 during a read operation. In some cases, the memory controller 140 may activate/deactivate a second cascode thereby enabling the charge to be transferred between the memory cell 105 and the capacitor through a first cascode and the second cascode during the read operation. The first cascode may be coupled with the memory cell 105 and a sense component (e.g., sense component 125), and the second cascode may be coupled with the capacitor and the sense component (e.g., sense component 125). The memory controller 140 may determine a logic state stored on the memory cell based on the charge transferred through the first cascode and the second cascode.

In general, the amplitude, shape, or duration of an applied voltage or current discussed herein may be adjusted or varied and may be different for the various operations discussed in operating the memory array 100. Furthermore, one, multiple, or all memory cells 105 within memory array 100 may be accessed simultaneously; for example, multiple or all cells of memory array 100 may be accessed simultaneously during an access (or write or program) operation in which all memory cells 105, or a group of memory cells 105, are set or reset to a single logic state. It should be appreciated that the exact operation of the memory device may be altered based on the type of memory cell and/or the specific access lines used in the memory device. In some examples where other access lines e.g., plate lines, may be present, a corresponding plate line in collaboration with a word line and a digit line may need to be activated to access a certain memory cell 105 of the memory array. It should be appreciated that the exact operation of the memory device may vary based on the type of memory cell and/or the specific access lines used in the memory device.

Figure 2:
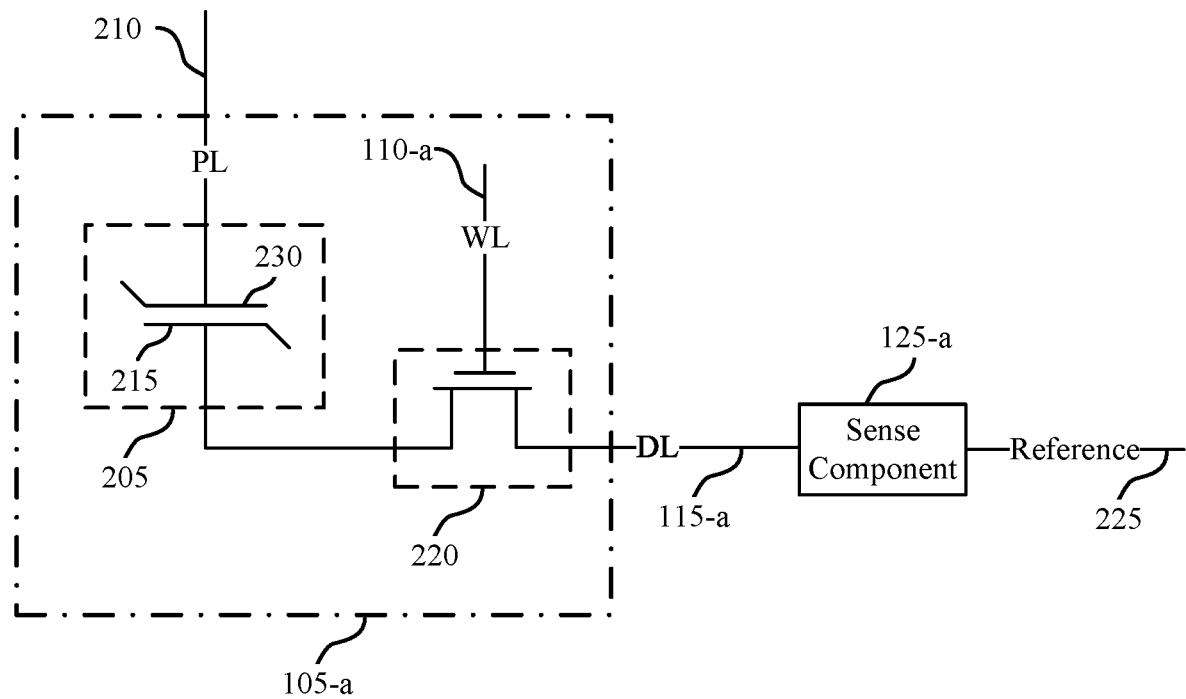
FIG. 2 illustrates an example of a circuit that supports techniques for sensing a memory cell in accordance with aspects of the present disclosure.

FIG. 2 illustrates an exemplary diagram 200 of a ferroelectric memory cell and circuit components that supports sensing a memory cell in accordance with aspects of the present disclosure. Circuit 200 includes a memory cell 105-a, word line 110-a, digit line 115-a, and sense component 125-a, which may be examples of a memory cell 105, word line 110, digit line 115, and sense component 125, respectively, as described with reference to FIG. 1. Memory cell 105-a may include a logic storage component, such as capacitor 205 that has a first plate, cell plate 230, and a second plate, cell bottom 215. Cell plate 230 and cell bottom 215 may be capacitively coupled through a ferroelectric material positioned between them. The orientation of cell plate 230 and cell bottom 215 may be flipped without changing the operation of memory cell 105-a. Circuit 200 also includes selector device 220 and reference line 225. Cell plate 230 may be accessed via plate line 210 and cell bottom 215 may be accessed via digit line 115-a. As described above, various states may be stored by charging or discharging the capacitor 205.

The stored state of capacitor 205 may be read or sensed by operating various elements represented in circuit 200. Capacitor 205 may be in electronic communication with digit line 115-a. For example, capacitor 205 can be isolated from digit line 115-a when selector device 220 is deactivated, and capacitor 205 can be connected to digit line 115-a when selector device 220 is activated. Activating selector device 220 may be referred to as selecting the memory cell 105-a. In some cases, selector device 220 is a transistor (e.g., thin-film transistor (TFT)) and its operation is controlled by applying a voltage to the transistor gate, where the voltage magnitude is greater than the threshold voltage magnitude of the transistor. Word line 110-a may activate the selector device 220; for example, a voltage applied to word line 110-a is applied to the transistor gate, connecting the capacitor 205 with digit line 115-a.

The digit line 115-a may be precharged to a first voltage during a read operation. In addition, a capacitor may be precharged to a second voltage, where the capacitor may be configured to integrate a charge associated with a memory cell 105-a during the read operation. Subsequently, word line 110-a may be biased to couple memory cell 105-a with the precharged digit line 115-a, which may be coupled with the precharged capacitor. Coupling memory cell 105-a with the precharged digit line 115-a may transfer a charge from the precharged capacitor to the memory cell 105-a through a first cascode and a second cascode during a first portion of the read operation. The second cascode may be configured to isolate the charged capacitor from the memory cell 105-a based on the charge transferred from the precharged capacitor to the memory cell 105-a. In some cases, a value of a voltage source applied to a gate of the second cascode (e.g., PMOS FET) and a threshold voltage of the second cascode (e.g., PMOS FET) are configured to deactivate the second cascode (e.g., PMOS FET) based on the charge transferred to the memory cell.

In other examples, the positions of selector device 220 and capacitor 205 may be switched, such that selector device 220 is connected between plate line 210 and cell plate 230 and such that capacitor 205 is between digit line 115-a and the other terminal of selector device 220. In this embodiment, selector device 220 may remain in electronic communication with digit line 115-a through capacitor 205. This configuration may be associated with alternative timing and biasing for read and write operations.

Due to the ferroelectric material between the plates of capacitor 205, and as discussed in more detail below, capacitor 205 may not discharge upon connection to digit line 115-a. In one scheme, to sense the logic state stored by ferroelectric capacitor 205, word line 110-a may be biased to select the memory cell 105-a and a voltage may be applied to plate line 210. In some cases, digit line 115-a is virtually grounded and then isolated from the virtual ground, which may be referred to as "floating," prior to biasing the plate line 210 and word line 110-a. Biasing the plate line 210 may result in a voltage difference (e.g., plate line 210 voltage minus digit line 115-a voltage) across capacitor 205. The voltage difference may yield a change in the stored charge on capacitor 205, where the magnitude of the change in stored charge may depend on the initial state of capacitor 205—e.g., whether the initial state stored a logic 1 or a logic 0. This may cause a change in the voltage of digit line 115-a based on the charge stored on capacitor 205. Operation of memory cell 105-a by varying the voltage to cell plate 230 may be referred to as "moving cell plate."

The change in voltage of digit line 115-a may depend on its intrinsic capacitance. That is, as charge flows through digit line 115-a, some finite charge may be stored in digit line 115-a and the resulting voltage may depend on the intrinsic capacitance. The intrinsic capacitance may depend on physical characteristics, including the dimensions, of digit line 115-a. Digit line 115-a may connect many memory cells 105 so digit line 115-a may have a length that results in a non-negligible capacitance (e.g., on the order of a hundred femtofarads (fF)). The resulting voltage of digit line 115-a may then be compared to a reference (e.g., a voltage of reference line 225) by sense component 125-a in order to determine the stored logic state in memory cell 105-a. Other sensing processes may be used.

Sense component 125-a may include various transistors or amplifiers to detect and amplify a difference in signals, which may be referred to as latching. Sense component 125-a may include a sense amplifier that receives and compares the voltage of digit line 115-a and reference line 225, which may be a reference voltage. The sense amplifier output may be driven to the higher (e.g., a positive) or lower (e.g., negative or ground) supply voltage based on the comparison. For instance, if digit line 115-a has a higher voltage than reference line 225, then the sense amplifier output may be driven to a positive supply voltage. In some cases, the sense amplifier may additionally drive digit line 115-a to the supply voltage. Sense component 125-a may then latch the output of the sense amplifier and/or the voltage of digit line 115-a, which may be used to determine the stored state in memory cell 105-a, e.g., logic 1. Alternatively, if digit line 115-a has a lower voltage than reference line 225, the sense amplifier output may be driven to a negative or ground voltage. Sense component 125-a may similarly latch the sense amplifier output to determine the stored state in memory cell 105-a, e.g., logic 0. The latched logic state of memory cell 105-a may then be output, for example, through column decoder 130 as output 135 with reference to FIG. 1.

To write memory cell 105-a, a voltage may be applied across capacitor 205. Various methods may be used. In one example, selector device 220 may be activated through word line 110-a in order to electrically connect capacitor 205 to digit line 115-a. A voltage may be applied across capacitor 205 by controlling the voltage of cell plate 230 (through plate line 210) and cell bottom 215 (through digit line 115-a). To write a logic 0, cell plate 230 may be taken high, that is, a positive voltage may be applied to plate line 210, and cell bottom 215 may be taken low, e.g., virtually grounding or applying a negative voltage to digit line 115-a. The opposite process is performed to write a logic 1, where cell plate 230 is taken low and cell bottom 215 is taken high.

Figure 3:
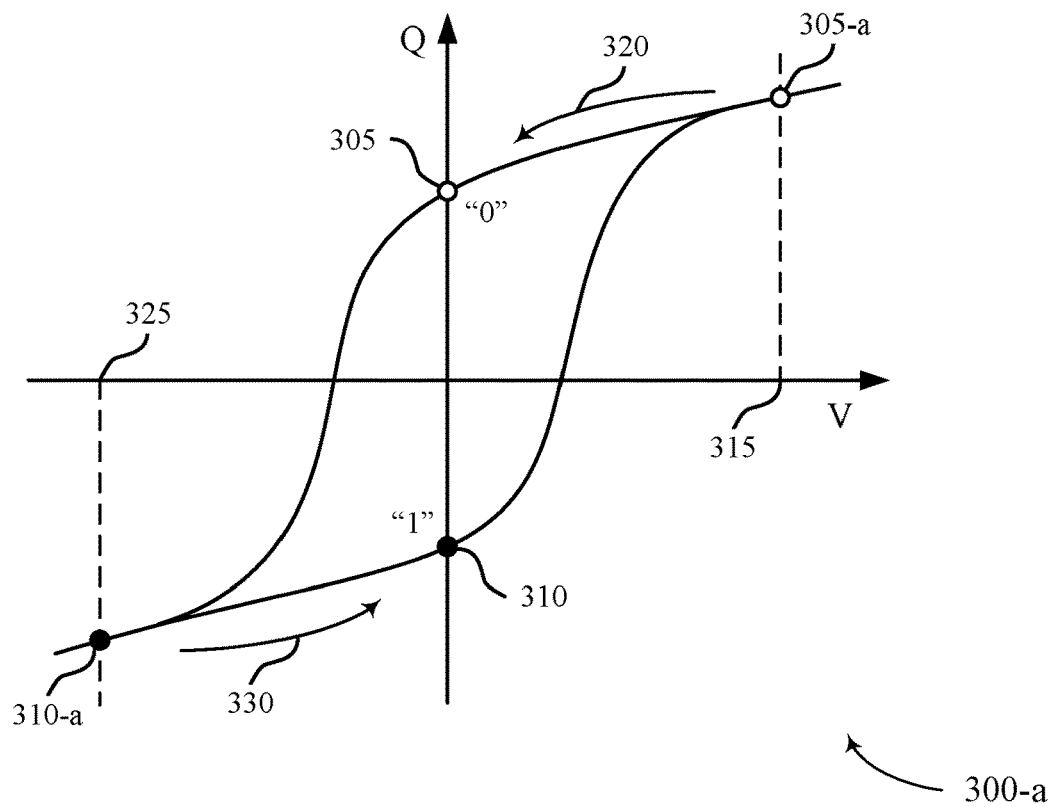
FIG. 3 illustrates an example of hysteresis curves that support sensing a memory cell in accordance with aspects of the present disclosure.
Figure 3:
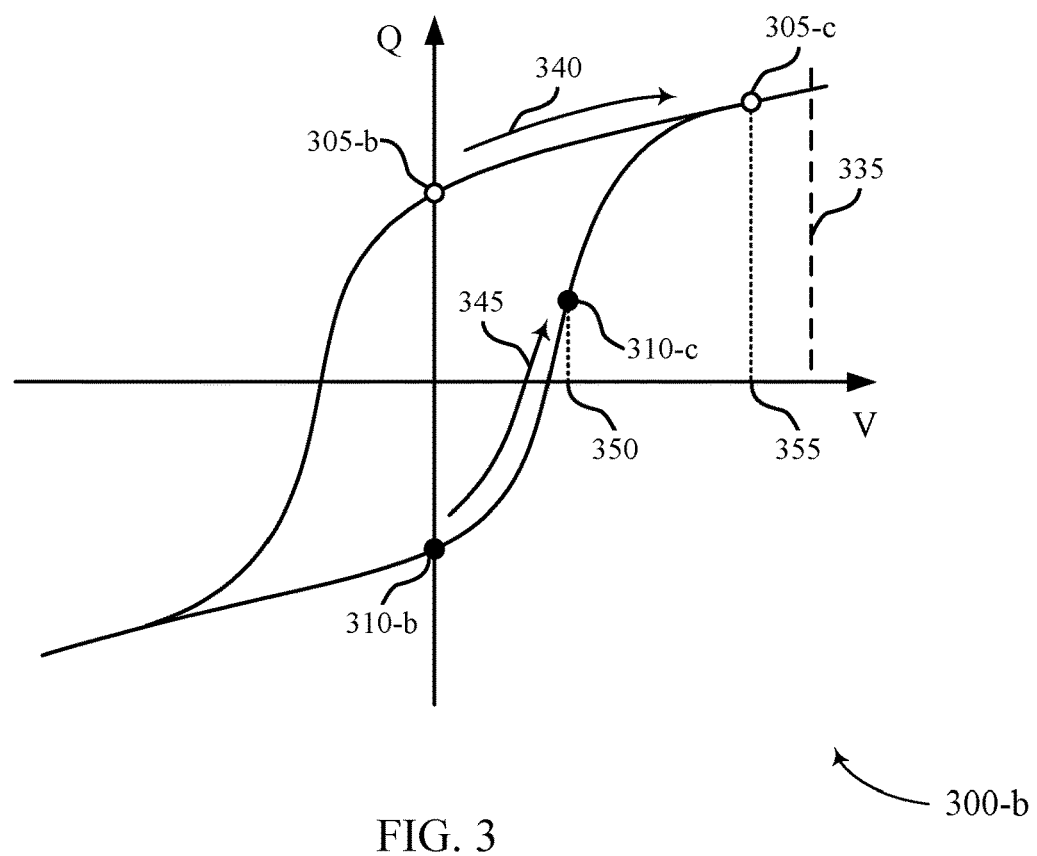

FIG. 3 illustrates an example of non-linear electrical properties with hysteresis curves 300-a and 300-b for a ferroelectric memory cell that supports sensing a memory cell in accordance with aspects of the present disclosure. Hysteresis curves 300-*a* and 300-*b* illustrate an example ferroelectric memory cell writing and reading process, respectively. Hysteresis curves 300 depict the charge, Q, stored on a ferroelectric capacitor (e.g., capacitor 205 of FIG. 2) as a function of a voltage difference, V.

A ferroelectric material is characterized by a spontaneous electric polarization, i.e., it maintains a non-zero electric polarization in the absence of an electric field. Example ferroelectric materials include barium titanate ($BaTiO_3$), lead titanate ($PbTiO_3$), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations as described above for some DRAM architectures.

Hysteresis curves 300-*a* and 300-*b* may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, it should be understood that the voltages in hysteresis curves 300 represent a voltage difference across the capacitor and are directional. For example, a positive voltage may be realized by applying a positive voltage to the terminal in question (e.g., a cell plate 230) and maintaining the second terminal (e.g., a cell bottom 215) at ground (or approximately zero volts (0V)). A negative voltage may be applied by maintaining the terminal in question at ground and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300-*a* and 300-*b*.

As depicted in hysteresis curve 300-*a*, the ferroelectric material may maintain a positive or negative polarization with a zero voltage difference, resulting in two possible charged states: charge state 305 and charge state 310. According to the example of FIG. 3, charge state 305 represents a logic 0 and charge state 310 represents a logic 1. In some examples, the logic values of the respective charge states may be reversed to accommodate other schemes for operating a memory cell.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-*a* is reached. Upon removing voltage 315, charge state 305-*a* follows path 320 until it reaches charge state 305 at zero voltage. Similarly, charge state 310 is written by applying a net negative voltage 325, which results in charge state 310-*a*. After removing negative voltage 325, charge state 310-*a* follows path 330 until it reaches charge state 310 at zero voltage. Charge states 305-*a* and 310-*a* may also be referred to as the remnant polarization (Pr) values, i.e., the polarization (or charge) that remains upon removing the external bias (e.g., voltage). The coercive voltage is the voltage at which the charge (or polarization) is zero.

To read, or sense, the stored state of the ferroelectric capacitor, a voltage may be applied across the capacitor. In response, the stored charge, Q, changes, and the degree of the change depends on the initial charge state—i.e., the final stored charge (Q) depends on whether charge state 305-*b* or 310-*b* was initially stored. For example, hysteresis curve 300-*b* illustrates two possible stored charge states 305-*b* and 310-*b*. Voltage 335 may be applied across the capacitor as discussed with reference to FIG. 2. In other cases, a fixed voltage may be applied to the cell plate and, although depicted as a positive voltage, voltage 335 may be negative. In response to voltage 335, charge state 305-*b* may follow path 340. Likewise, if charge state 310-*b* was initially stored, then it follows path 345. The final position of charge state 305-*c* and charge state 310-*c* depend on a number of factors, including the specific sensing scheme and circuitry.

In some cases, the final charge may depend on the intrinsic capacitance of the digit line connected to the memory cell. For example, if the capacitor is electrically connected to the digit line and voltage 335 is applied, the voltage of the digit line may rise due to its intrinsic capacitance. So a voltage measured at a sense component may not be equal to voltage 335 and instead may depend on the voltage of the digit line. In some cases, the digit line may be precharged a first voltage before the capacitor is electrically connected to the digit line during a read operation. The position of final charge states 305-*c* and 310-*c* on hysteresis curve 300-*b* may thus depend on the capacitance of the digit line and may be determined through a load-line analysis—i.e., charge states 305-*c* and 310-*c* may be defined with respect to the digit line capacitance. As a result, the voltage of the capacitor, voltage 350 or voltage 355, may be different and may depend on the initial state of the capacitor.

By comparing the digit line voltage to a reference voltage, the initial state of the capacitor may be determined. The digit line voltage may be the difference between voltage 335 and the final voltage across the capacitor, voltage 350 or voltage 355—i.e., (voltage 335-voltage 350) or (voltage 335-voltage 355). A reference voltage may be generated such that its magnitude is between the two possible voltages of the two possible digit line voltages in order to determine the stored logic state—i.e., if the digit line voltage is higher or lower than the reference voltage. For example, the reference voltage may be an average of the two quantities, (voltage 335-voltage 350) and (voltage 335-voltage 355). Upon comparison by the sense component, the sensed digit line voltage may be determined to be higher or lower than the reference voltage, and the stored logic value of the ferroelectric memory cell (i.e., a logic 0 or 1) may be determined.

Figure 4:
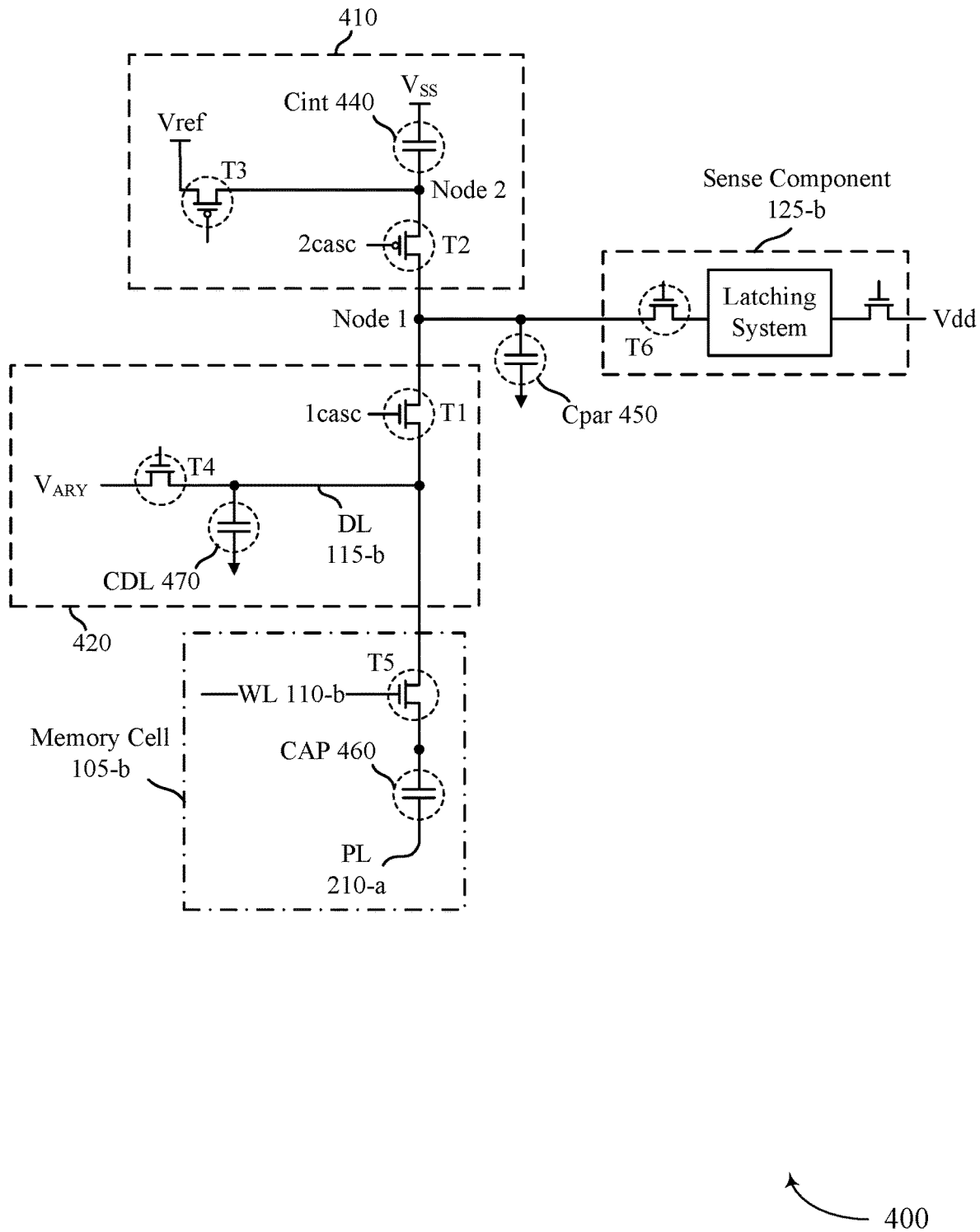
FIG. 4 illustrates an example of a circuit that supports sensing a memory cell in accordance with aspects of the present disclosure.

An amount of charge needed by the capacitor (e.g., a ferroelectric capacitor 205 described with reference to FIG. 2) during a read operation may be supplied by one or more capacitors—e.g., Cint 440 and Cpar 450 as depicted in FIG. 4. Cint may be configured to precharge to a second voltage to provide a charge during a first portion of the read operation. In addition, a cascode (e.g., PMOS FET) may be configured to isolate Cint based on the charge has been transferred from Cint to the capacitor. Subsequently, an additional charge may be transferred from Cpar to the capacitor during a second portion of the read operation—e.g., when Cint is isolated from the capacitor. In some cases, the capacitance of Cint may be configured to be greater than that of Cpar. The change in capacitance values of the capacitors (e.g., Cint and Cpar) that are configured to supply the amount of charge needed by the capacitor may result in a non-linear characteristics in the digit line voltage. Consequently, the non-linear characteristics in the digit line voltage may provide a larger sense window with respect to the reference voltage to determine a logic state stored on the capacitor.

As discussed above, reading a memory cell that does not use a ferroelectric capacitor may degrade or destroy the stored logic state. A ferroelectric memory cell, however, may maintain the initial logic state after a read operation. For example, if charge state 305-b is stored, the charge state may follow path 340 to charge state 305-c during a read operation and, after removing voltage 335, the charge state may return to initial charge state 305-b by following path 340 in the opposite direction.

FIG. 4 illustrates an example of a circuit 400 that supports sensing a memory cell in accordance with aspects of the present disclosure. The circuit 400 illustrates a simplified circuit configuration to highlight several circuit components collaborating to facilitate sensing a memory cell. The circuit 400 includes a precharge circuit 410, an access circuit 420, a memory cell 105-b, and a sense component 125-b. Sense component 125-b may be an example of or some portion of the sense component 125 or 125-a described with reference to FIGS. 1 and 2. Memory cell 105-b may be an example of the memory cell 105 or 105-a described with reference to FIG. 1 or 2. Precharge circuit 410 and access circuit 420 may collaborate to sense a logic state stored on the memory cell 105-b during a read operation as further described with reference to FIGS. 5 and 6.

Precharge circuit 410 may be configured to provide a charge to the memory cell 105-b during a read operation. Precharge circuit 410 may include Cint 440 that is configured to integrate the charge associated with the memory cell 105-b during the read operation. In some cases, integrating the charge associated with the memory cell 105-b may be manifested as a change in a voltage of a node coupled with the memory cell 105-b. Precharge circuit 410 may also include a second transistor T2 (e.g., a second cascode) coupled with Cint 440 and sense component 125-b (e.g., through Node 1). T2 may be configured to selectively couple and/or selectively isolate Cint 440 from the first node (e.g., Node 1) during various portions of the read operation. In some cases, T2 may be in a cascode configuration where a voltage source (e.g., 2casc signal) is coupled with a gate of T2. In some cases, T2 may be a p-type metal oxide semiconductor (PMOS) field effect transistors (FET). Precharge circuit 410 may further include a third transistor T3 coupled with Cint 440 and Node 2 (e.g., a second node) of T2. T3 may be configured to precharge Cint 440 to Vref during the read operation. The other terminal of Cint 440 may be coupled with Vss. In some cases, Vss may be a stable, constant voltage (e.g., 0V or virtual ground). In some cases, the precharge circuit 410 may be referred to as a circuit.

Access circuit 420 may be configured to establish a voltage at Node 1 in collaboration with the precharge circuit 410 during a read operation. The voltage at Node 1 established during the read operation may indicate a logic state stored on the memory cell 105-b. In some cases, access circuit 420 includes a first transistor T1 (e.g., a first cascode) coupled with memory cell 105-b and sense component 125-b. T1 may be in a cascode configuration where a voltage source (e.g., 1casc signal) is coupled with a gate of T1. In some cases, T1 may be an n-type metal oxide semiconductor (NMOS) FET. In some cases, T1 and T2 are each coupled with a first node (e.g., Node 1) that is coupled with sense component 125-b. When T1 is activated (e.g., by biasing the gate of T1 using 1casc signal), T1 may couple Node 1 with a precharged digit line (e.g., DL 115-b precharged to VARY). In some cases, DL 115-b may have been coupled with the memory cell 105-b when T1 is activated to couple Node 1 with DL 115-b. DL 115-b may be an example of the digit line 115 described with reference to FIGS. 1 and 2. In some cases, T4 may couple DL 115-b with VARY such that digit line 115-b may be precharged prior to be coupled with Node 1 (or with the memory cell 105-b in some cases). In some cases, CDL 470 may represent an intrinsic capacitance associated with DL 115-b, and may depend on physical characteristics, including the dimensions, of DL 115-b. In some cases, precharging a digit line (e.g., DL 115-b) during a read operation may mitigate an effect of the intrinsic capacitance of digit line (e.g., CDL 470) while establishing the voltage at Node 1 that is indicative of a logic state stored on a memory cell. In some cases, the access circuit 420 may be referred to as a circuit.

Memory cell 105-b may include a selector device T5 and a capacitor (e.g., CAP 460). CAP 460 may be an example of the capacitor 205 described with reference to FIG. 2. Selector device T5 may be an example of the selector device 220 described with reference to FIG. 2. Further, the memory cell 105-b may be associated with a word line (e.g., WL 110-b). WL 110-b may be an example of the word line 110 described with reference to FIGS. 1 and 2. In some cases, CAP 460 may be a FeRAM capacitor of the memory cell 105 described with reference to FIGS. 1 and 2. CAP 460 may store a logic state (e.g., a logic state 1 or a logic state 0). In some cases, CAP 460 storing a first logic state (e.g., a logic state 1) may receive a first amount of charge, and CAP 460 storing a second logic state (e.g., a logic state 0) may receive a second amount of charge during a read operation. In some cases, the first amount of charge may be greater than the second amount of charge. In some cases, the first logic state may be referred to as a logic state receiving a more charge, and the second logic state may be referred to as a logic state receiving a less charge. During an access operation (e.g., a read operation to determine a logic state stored on CAP 460), WL 110-b may be biased (e.g., selected) to activate T5 such that CAP 460 may be coupled with DL 115-b, which may have been precharged to VARY.

Sense component 125-b may be configured to determine a logic state stored on memory cell 105-b during a read operation. In some cases, sense component 125-b may determine the logic state stored on the memory cell 105-b based on the charge transferred through T1 (e.g., first cascode) and T2 (e.g., second cascode) during the read operation. In some cases, T6 (e.g., a switching component) may couple Node 1 (e.g., the first node) with the sense component 125-b during the read operation such that the sense component 125-b may compare the voltage at Node 1 (e.g., the voltage indicative of the logic state stored on memory cell 105-b) and a reference voltage (e.g., Vdd).

In some cases, Node 1 may be coupled with a capacitor (e.g., Cpar 450). Cpar 450 may represent a parasitic capacitance associated with Node 1. Cpar 450 (e.g., Node 1) may be configured to transfer an additional charge to memory cell 105-b based on Cint 440 being isolated from memory cell 105-b (e.g., when T2 isolates Cint 440 from Node 1). In some cases, Cpar 450 (e.g., Node 1) may be configured to discharge the voltage of Node 1 with a second rate of change during a second portion of the read operation (e.g., when Cint 440 is isolated from memory cell 105-b).

In some cases, the first cascode and the second cascode are each coupled with a first node that is coupled with the sense component. In some cases, the circuit 400 may include a switching component coupled with the first node and the sense component, the switching component being configured to selectively couple the first node with the sense component during the read operation. In some cases, the second cascode is configured to enable a sense window during the read operation based at least in part on the second cascode being coupled with the capacitor and the sense component. In some cases, precharge circuit 410 may include a switching component coupled with the capacitor and a second node of the second cascode, the switching component is configured to precharge the capacitor to a first voltage during the read operation.

In some cases, the second cascode is configured to isolate the capacitor from the memory cell after transferring at least a portion of the charge to the memory cell during the read operation. In some cases, the circuit 400 may include a second capacitor coupled with a first node, wherein the second capacitor is configured to transfer an additional charge to the memory cell after the capacitor is isolated from the memory cell. In some cases, the second capacitor comprises a parasitic capacitance at the first node.

In some cases, at least the first node or the capacitor is configured to discharge a first voltage with a first rate of change during a first portion of the read operation. In some cases, at least the first node or the second capacitor is configured to discharge a second voltage with a second rate of change during a second portion of the read operation when the memory cell stores a first logic state, wherein the second rate of change is greater than the first rate of change. In some cases, the first rate of change and the second rate of change configure a sense window during the read operation. In some cases, the memory cell is configured to receive, when the memory cell stores a first logic state, a first amount of charge during the read operation that is greater than a second amount of charge received when the memory cell stores a second logic state.

In some cases, the first cascode comprises an n-type metal oxide semiconductor (NMOS) field effect transistor (FET) and the second cascode comprises a p-type metal oxide semiconductor (PMOS) field effect transistors (FET). In some cases, a value of a voltage source applied to a gate of the second cascode and a threshold voltage of the second cascode are configured to deactivate the second cascode when the charge has been transferred from the capacitor to the memory cell during the read operation.

Detail operations of precharge circuit 410 that supports sensing a memory cell is further illustrated as described with reference to FIG. 5. In addition, aspects of determining various parameters associated with the precharge circuit 410 to provide a large sense window during a read operation is described.

Figure 5:
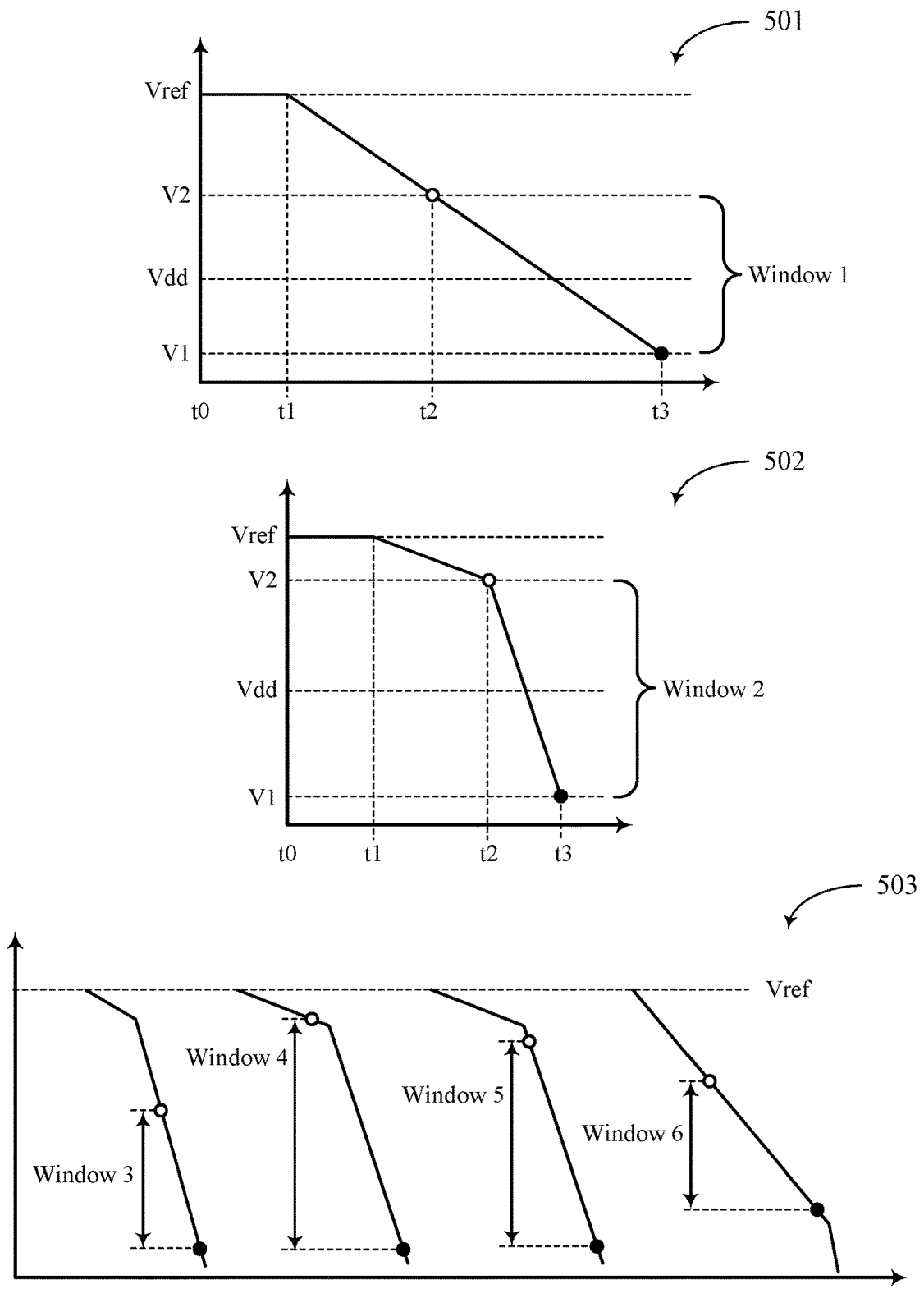
FIG. 5 illustrates an example of a sense window diagram that supports sensing a memory cell in accordance with aspects of the present disclosure.

FIG. 5 illustrates examples of sense window diagrams 501 through 503 that supports sensing a memory cell in accordance with aspects of the present disclosure. Diagrams 501 through 503 may depict aspects of operations of the circuit 400 described with reference to FIG. 4. More specifically, diagrams 501 through 503 may describe behaviors of a voltage at Node 1 (e.g., Node 1 described with reference to FIG. 4) in y-axis as a function of time in x-axis during a read operation to determine a logic state stored on a memory cell (e.g., memory cell 105-*b* described with reference to FIG. 4). As described above, the voltage at Node 1 may indicate a logic state stored on memory cell 105-*b* during a read operation. A digit line (e.g., DL 115-*b* described with reference to FIG. 4) associated with the memory cell 105-*b* may have been precharged to a first voltage (e.g., VARY described with reference to FIG. 4) and coupled to Node 1 prior to time t1. In addition, T3 (e.g., T3 described with reference to FIG. 4) may have precharged a capacitor (e.g., Cint 440 coupled with Node 1 as described with reference to FIG. 4) to Vref prior to time t1. T3 may have been deactivated to isolate Node 2 and Cint 440 from Vref when Cint 440 is charged to Vref. At time t1, a word line associated with the memory cell 105-*b* (e.g., WL 110-*b* described with reference to FIG. 4) may be biased to activate a selector device (e.g., T5 described with reference to FIG. 4) to couple the memory cell 105-*b* with the precharged digit line 115-*b*.

Diagram 501 may illustrate behavior of a voltage at Node 1 when T2 (e.g., T2 described with reference to FIG. 4) is absent—namely, when Node 1 and Node 2 are electrically shorted. Because Node 1 and Node 2 are shorted in this example, the shorted node may be referred to as Node 1. At time t1, when the memory cell 105-*b* is coupled to Node 1 by activating T5, Cint 440 may begin to transfer a charge to be received by the memory cell 105-*b*. The rate of charge transfer may be represented as a current/o flowing through T1 toward the memory cell 105-*b*. As a result of transferring the charge, the voltage at Node 1 may start to decrease from the precharged voltage (e.g., Vref) at time t1. A rate of change in the voltage at Node 1 may be determined by/o/C1, where C1 corresponds to a capacitance value of Cint 440. At time t2, Cint 440 may have transferred a second amount of charge to the memory cell 105-*b* when the memory cell 105-*b* stores a second logic state that should have the second amount of charge (e.g., a logic state receiving a less amount of charge as denoted by a white dot in FIG. 5). At the time t2, the voltage at Node 1 may correspond to V2.

Still referring to diagram 501, when the memory cell 105-*b* stores a first logic state that should have a first amount of charge (e.g., a logic state receiving a more charge as denoted by a black dot in FIG. 5), Cint 440 may continue to transfer an additional charge to the memory cell 105-*b*. In some cases, the first amount of charge is greater than the second amount of charge. The rate of change in the voltage at Node 1 may remain unchanged (e.g., the rate of change in the voltage at Node 1 may be determined by Io/C1) while Cint 440 transfers the additional charge for the memory cell 105-*b* to receive. At time t3, Cint 440 may have supplied the first amount of charge to the memory cell 105-*b* that stores the first logic state. At time t3, the voltage at Node 1 may correspond to V1.

The voltage at Node 1 may be coupled to sense component 125-*b* by activating T6 (e.g., T6 described with reference to FIG. 4), and thus the voltage difference (e.g., window 1) between V1 (e.g., the voltage at Node 1 corresponding to a memory cell storing the second logic state) and V2 (e.g., the voltage Node 1 corresponding to a memory cell storing the first logic state) may be associated with a sense window available for the sense component 125-*b*. A reference voltage (e.g., Vdd described with reference to FIG. 4) may be determined to be placed within the window 1 (e.g., near the center of window 1). The voltage at Node 1 may exhibit a linear or a nearly linear behavior or, in some cases, a non-linear behavior with respect to time.

Diagram 502 may illustrate behavior of a voltage at Node 1 when T2 (e.g., T2 described with reference to FIG. 4) is present as depicted in precharge circuit 410. Diagram 502 illustrates behavior when T2 is in a cascode configuration and is positioned between Node 1 and Node 2. At time t1, when the memory cell 105-*b* is coupled to Node 1 by activating T5, Cint 440 may begin to transfer a charge for the memory cell 105-*b* to receive. The rate of charge transfer may be represented as a current Io flowing through T1 and T2 toward the memory cell 105-*b*. As a result of transferring the charge, the voltage at Node 1 (e.g., the voltage across Cint 440) may start to decrease from the precharged voltage (e.g., Vref) at time t1. A rate of change in the voltage at Node 1 may be determined by Io/C1, where C1 corresponds to a capacitance value of Cint 440. The capacitance value of the Cint 440 of diagram 502 may be different (e.g., greater) than the capacitance value of the Cint 440 of diagram 501 to provide a larger sense window during the read operation than the sense window (e.g., window 1) of diagram 501. At time t2, Cint 440 may have transferred a second amount charge to the memory cell 105-*b* when the memory cell 105-*b* stores a second logic state that should have the second amount of charge (e.g., a logic state receiving a less charge as denoted by a white dot in FIG. 5). At time t2, the voltage at Node 1 may correspond to V2. The time period between time t1 and time t2 may be referred to as a first portion of a read operation.

At time t2—e.g., when the second amount of charge has been transferred from Cint 440 to the memory cell 105-*b* resulting in the voltage at Node 1 reaching V2, T2 may be deactivated to isolate Cint 440 from Node 1 (e.g., memory cell 105-*b*). In some cases, T2 may be deactivated when V2 reaches 2casc+Vtp, where 2casc corresponds to the voltage applied to a gate of T2 and Vtp corresponds to the threshold voltage of T2. The amount of reduction in the voltage at Node 2 (e.g., Vref–V2) at time t2 may be based on the capacitance value of Cint 440 of diagram 502. In addition, when the capacitance value of the Cint 440 is determined to be sufficiently large, Vref may be reduced accordingly to decrease power consumption by the circuit 400 during a read operation.

In practice, such configuration of T2 (e.g., particular values of the gate voltage and the threshold voltage of T2) may not always produce a timing precisely matching the timing of transferring the second amount of charge for each memory cell 105-*b* due to normal process variations resulting in a distribution of the second amount of charge. For example, each memory cell 105-*b* may exhibit a slightly different value of the second amount of charge to receive. As such, parameters of precharge circuit 410 may be determined during a product testing stage to determine a most suitable configuration of the precharge circuit 410 (e.g., determining particular values of Vref or 2casc signal) for majority of memory cells within a memory array in view of a certain criterion of acceptable error rate during a read operation.

Still referring to diagram 502, when the memory cell 105-*b* stores a first logic state that should have a first amount of charge (e.g., a logic state receiving a more charge as denoted by a black dot in FIG. 5), Cpar 450 may start to transfer an additional charge for the memory cell 105-*b* at time t2. The time period between time t2 and time t3 may be referred to as a second portion of a read operation. The rate of change in the voltage at Node 1 during the second portion of read operation may be different (e.g., faster) than the rate of change in the voltage at Node 1 during the first portion of read operation. The rate of change in the voltage at Node 1 during the second portion of read operation (e.g., while Cpar 450 supplies the additional charge to the memory cell 105-*b*) may be determined by Io/C2, where C2 corresponds to a capacitance value of Cpar 450. In some cases, the capacitance value of Cpar 450 may be less than the capacitance value of Cint 440 to provide a large sense window. At time t3, Cpar 450 may have supplied the additional charge to the memory cell 105-*b* that stores the first logic state. At time t3, the voltage at Node 1 may correspond to V1.

As described above, the voltage at Node 1 may be coupled to sense component 125-*b* by activating T6 (e.g., T6 described with reference to FIG. 4), and thus the voltage difference (e.g., window 2) between V1 (e.g., the voltage at Node 1 corresponding to a memory cell storing the second logic state) and V2 (e.g., the voltage at Node 1 corresponding to a memory cell storing the first logic state) may be associated with a sense window available for the sense component 125-*b* during a read operation. In some cases, window 2 may be configured to be greater than window 1 based on various parameters of precharge circuit 410—e.g., Vref value, capacitance value of Cint 440, a cascode configuration of T2 based on T2's threshold voltage and 2casc signal. A reference voltage (e.g., Vdd described with reference to FIG. 4) may be determined to be within the window 2 (e.g., near the center of window 2). It should be appreciated that the capacitance associated with Node 1 may be non-linear (e.g., Cint 440 during the first portion and Cpar 450 during the second portion) and vary in time during a read operation (e.g., during the first portion and the second portion of the read operation). Consequently, the voltage at Node 1 of diagram 502 may exhibit a non-linear behavior with respect time to provide a larger sense window—e.g., window 2 that is greater than window 1.

In some cases, the time period between time t1 and time t2 may correspond to a first portion of a read operation, during which the first node (e.g., Node 1) or Cint 440 is configured to discharge a first voltage (e.g., Vref) with a first rate of change. In some cases, the time period between time t2 and time t3 may correspond to a second portion of a read operation, during which the first node (e.g., Node 1) or the second capacitor (e.g., Cpar 450) is configured to discharge a second voltage (e.g., V1 at Node 1) with a second rate of change when the memory cell 105-*b* stores a first logic state, wherein the second rate of change is greater than the first rate of change. In some cases, the first rate of change and the second rate of change configure a sense window during the read operation.

Diagram 503 may further illustrate aspects of determining various parameters of precharge circuit 410 to provide a large sense window during a read operation. Diagram 503 may illustrate behavior of a voltage at Node 1 when T2 (e.g., T2 described with reference to FIG. 4) is present as depicted in the precharge circuit 410—namely, T2 is positioned between Node 1 and Node 2. Further, diagram 503 may illustrate behavior of the voltage at Node 1 during a first portion (e.g., time period between t1 and t2) and a second portion (e.g., time period between t2 and t3) of the read operation for four different conditions of the parameters providing four different sense windows (e.g., sense windows 3 through 6).

Window 3 may correspond to a condition, in which T2 isolates Cint 440 from Node 1 too early to take advantage of a non-linear behavior of the capacitance associated with Node 1. In some cases, window 3 may occur due to various parameters—e.g., a small Vref, a small capacitance value of Cint 440, a high threshold voltage of T2, a high value of 2casc signal, or any combination thereof. For example, window 3 may occur when Cint 440 becomes isolated (e.g., the first portion ends) and Cpar 450 transfers additional charge for memory cell 105-*b* to receive (e.g., during the second portion) regardless of a logic state stored on memory cell 105-*b*. As such, although the capacitance associated with Node 1 may exhibit a non-linear behavior, the voltage at Node 1 may not exhibit a non-linear behavior to provide a large sense window during a read operation.

Window 6 may correspond to another condition, in which T2 isolates Cint 440 from Node 1 too late to take advantage of a non-linear behavior of the capacitance associated with Node 1. In some cases, window 6 may occur due to various parameters—e.g., a large Vref, a large capacitance value of Cint 440, a low threshold voltage of T2, a small value of 2casc signal, or any combination thereof. For example, window 6 may occur when Cint 440 remains coupled with Node 1 to transfer a charge for memory cell 105-*b* regardless of the logic state stored on the memory cell. In some cases, window 6 may be regarded as the situation similar to diagram 501. Although the capacitance associated with Node 1 may exhibit a non-linear behavior, the voltage at Node 1 may not exhibit a non-linear behavior to provide a large sense window during a read operation.

Window 4 and window 5 may correspond to conditions, in which the precharge circuit 410 is suitably configured to provide a large sense window. As described above, the transition time between the first portion and the second portion of a read operation (e.g., time t2) may not occur precisely matching the timing of transferring the second amount of charge for each memory cell 105-*b* to receive. However, window 4 and window 5 may each represent a condition, in which memory cell 105-*b* may exhibit a slightly different value of the second amount of charge to receive, respectively.

For example, window 4 may correspond to a condition, in which Cint 440 transfers a portion of additional charge to memory cell 105-*b* before T2 isolates Cint 440 from Node 1—e.g., the memory cell 105-*b* has received the second amount of charge, and Cint 440 is still coupled with Node 1, briefly. Similarly, window 5 may correspond to a condition, in which T2 isolates Cint 440 slightly early such that Cpar 450 may transfer a portion of the second amount of charge to memory cell 105-*b*—e.g., Cint 440 is isolated from Node 1 when the memory cell 105-*b* has not yet received the second amount of charge. However, both window 4 and window 5 may represent a suitable configuration of the precharge circuit 410 to provide a large sense window taking advantage of the non-linear capacitance behavior (e.g., non-linear behavior of the voltage at Node 1) during a read operation.

In some cases, the precharge circuit 410 may provide various options for determining various parameters of a memory device during a read operation. In some cases, a capacitance value of Cint 440 and a threshold voltage value of T2 (e.g., a second cascode) may be determined based on a desired product die area or a desired power consumption. Such determination may be based on available characteristics of a memory cell (e.g., memory cell 105-*b*). In addition, a value of a precharge voltage for Cint 440 (e.g., Vref) or a value of voltage applied to a gate of T2 (e.g., 2casc signal) or both may be further determined based on a desired product die area or a desired power consumption. In some cases, these determinations may be made during a product design stage or during a product testing stage. For example, determining Vref or 2casc signal may occur during a product testing stage after having fabricated the product in view of actual characteristics of a memory of the product. Such options determining various parameters of the precharge circuit 410 may offer a latitude to produce a large sense window (e.g., window 2, window 4, window 5) during a read operation. In some cases, various characteristics may be altered after the memory device is in use (e.g., Vref) using trimming or other techniques.

Detail operations of the circuit 400, including operations of precharge circuit 410 and access circuit 420 during various phases of a read operation, that supports sensing a memory cell is further illustrated as described with reference to FIG. 6.

Figure 6:
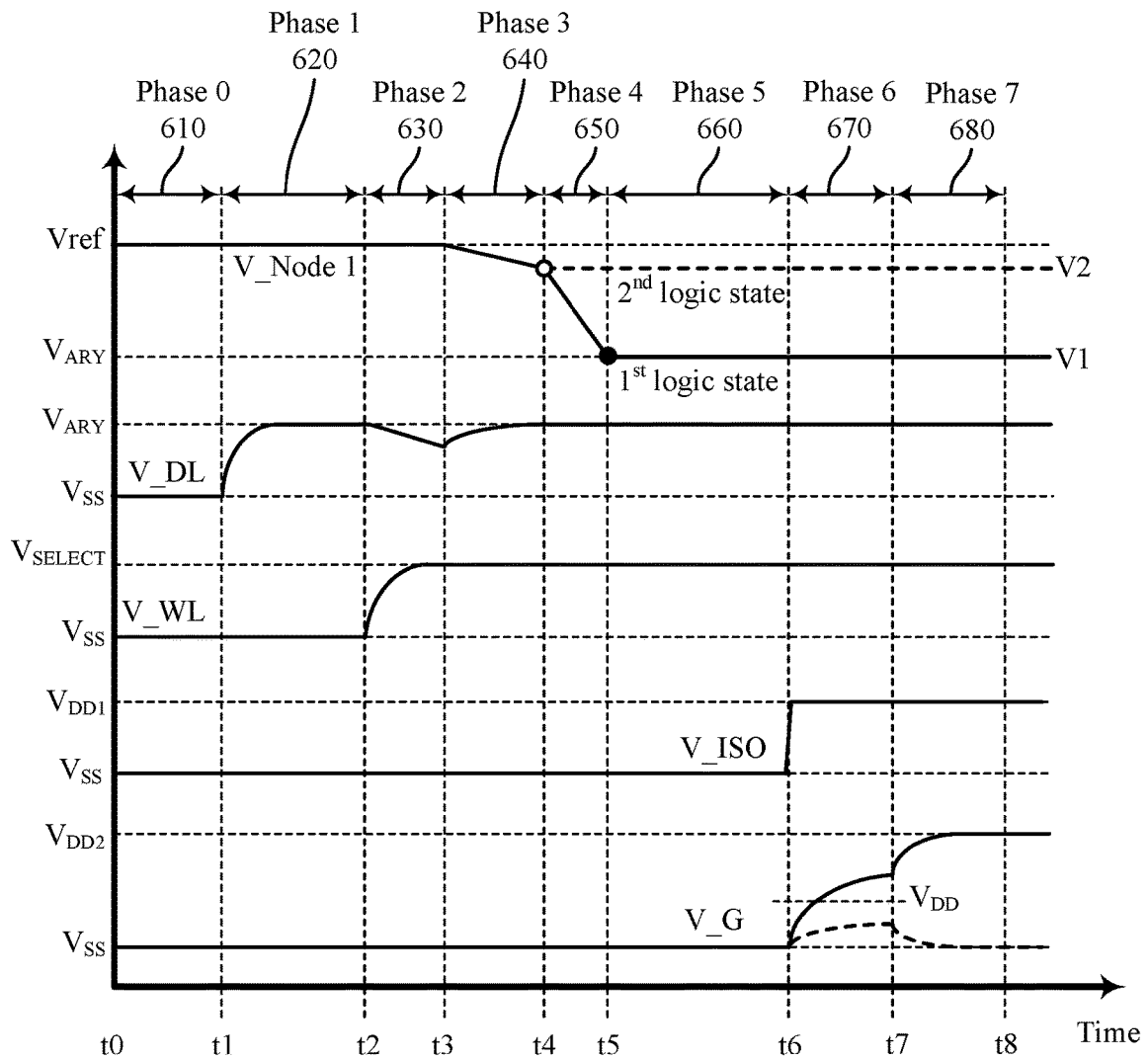
FIG. 6 illustrates an example of a timing diagram that supports sensing a memory cell in accordance with aspects of the present disclosure.

FIG. 6 illustrates an example of a timing diagram 600 that supports sensing a memory cell in accordance with aspects of the present disclosure. The timing diagram 600 illustrates procedures during a read operation to sense a logic state stored on a memory cell. The timing diagram 600 shows various voltage levels (e.g., voltage signals as a function of time) associated with the components and the nodes of the circuit 400 described with reference to FIG. 4 to illustrate how sensing a memory cell may be performed. The time and voltage scales used in FIG. 6 are for illustration purposes only, and may not precisely depict particular values in some cases. The timing diagram 600 includes a voltage at Node 1, V_Node 1 (e.g., Node 1 described with reference to FIGS. 4 and 5), a voltage associated with DL 115-*b* (i.e., V_DL), a voltage associated with WL 110-*b* (i.e., V_WL), a voltage applied to a gate of T6 (i.e., V_ISO), a voltage associated with a sensing node of a sense component, V_G (e.g., sense component 125-*b* described with reference to FIG. 4).

Before the initial phase 610 (e.g., phase 0), Node 1 may have been precharged. In some cases, V_Node 1 may be at Vref during the initial phase 610. In addition, Cint 440 may have been precharged to Vref by activating T3. Based on precharging Cint 440 to Vref, T3 may be deactivated during the initial phase 610 such that Vref is isolated from Node 2. Further, T2 may be activated by biasing a gate of T2 using 2casc signal to establish Vref at Node 1.

At time t1, the first phase 620 (e.g., phase 1) may begin where precharging DL 115-*b* may begin. At time t1, a gate of T4 may be biased to activate T4. As a response to activating T4, DL 115-*b* may be coupled with VARY. Consequently, V_DL may rise to VARY from Vss (e.g., virtual ground) during the first phase 620. CDL 470 (e.g., intrinsic capacitance associated with DL 115-*b*) may result in a rise time in V_DL during the first phase 620 as illustrated in FIG. 6.

At time t2, the second phase 630 (e.g., phase 2) may begin where WL 110-*b* may be selected to couple the memory cell 105-*b* to the precharged DL 115-*b*. At time t2, a gate of T5 may be biased to activate T5. In some cases, WL 110-*b* may be associated with parasitic elements (e.g., a parasitic resistance and a parasitic capacitance, which in combination may result in a delay for V_WL to rise), and V_WL (e.g., the voltage associated with WL 110-*b*) may exhibit a rise time during the second phase 630 as illustrated in FIG. 5. As V_WL rises to activate T5, T5 may couple CAP 460 with the precharged DL 115-*b* (e.g., CDL 470). As a result, the CDL 470 and CAP 460 may be coupled in parallel configuration to initiate charge sharing between CDL 470 and CAP 460. Consequently, V_DL may start to decrease due to the charge sharing between CDL 470 and CAP 460 during the second phase 630.

At time t3, the third phase 640 (e.g., phase 3) may begin where Cint 440 may transfer a charge to memory cell 105-*b* (e.g., CAP 460 and CDL 470 coupled in parallel configuration). During the third phase 640, T1 may be activated by biasing a gate of T1 using 1casc signal to couple the memory cell 105-*b* (e.g., CAP 460 and CDL 470 coupled in parallel configuration) with Node 1. As a result of coupling the memory cell 105-*b* with Node 1, Cint 440 may start to transfer a charge to the memory cell 105-*b*. As the memory cell 105-*b* (e.g., CAP 460 and CDL 470 coupled in parallel configuration) receives the charge from Cint 440, V_DL may rise back to VARY during the third phase.

At the end of the third phase 640 (e.g., at time t4), V_Node 1 may be reduced to 2casc+Vtp, where 2casc corresponds to the voltage applied to a gate of T2 and Vtp corresponds to the threshold voltage of T2, such that T2 may be deactivated to isolate Cint 440 from Node 1 (e.g., memory cell 105-*b* coupled with Node 1). At time t4, Cint 440 may have transferred a second amount of charge to the memory cell 105-*b*. The second amount of charge may correspond to a second logic state stored on the memory cell 105-*b*, and the memory cell 105-*b* (e.g., CAP 460) storing the second logic state may receive a less amount of charge during the read operation than a memory cell 105-*b* (e.g., CAP 460) storing a first logic state. In some cases, the time period between time t3 and time t4 may be referred to as a first portion of read operation (e.g., time period between time t1 and time t2 of diagram 502 described with reference to FIG. 5). In some cases, V_Node 1 at time t4 may correspond to V2 described with reference to diagram 502 of FIG. 5.

At time t4, the fourth phase 650 (e.g., phase 4) may begin where Cpar 450 may transfer an additional charge to the memory cell 105-*b* based on the logic state stored on the memory cell 105-*b*. For example, if the memory cell 105-*b* stores a second logic state, the memory cell 105-*b* may not accept much more charge after time t4. Consequently, V_Node 1 may settle into a second voltage level (e.g., V2). In other examples, if the memory cell 105-*b* stores a first logic state, the memory cell 105-*b* may accept more charge after time t4 from Cpar 450. As Cpar 450 (e.g., Node 1) transfers the additional charge to the memory cell 105-*b*, V_Node 1 may further decrease. At the end of the fourth phase 650 (e.g., at time t5), V_Node 1 may settle into a steady state that is indicative of the logic state stored on the memory cell 105-*b*. In some cases, the memory cell 105-*b* (e.g., CAP 460) may store the first logic state, and CAP 460 storing the first logic state may receive a first amount of charge. The memory cell 105-*b* (e.g., CAP 460) storing the first logic state may receive a greater amount of charge during the read operation than a memory cell 105-*b* (e.g., CAP 460) storing the second logic state. In some cases, the time period between time t4 and time t5 may be referred to as a second portion of read operation (e.g., time period between time t2 and time t3 of diagram 502 described with reference to FIG. 5). In some cases, V_Node 1 at time t5 may correspond to V1 described with reference to diagram 502 of FIG. 5.

At time t5, the fifth phase 660 (e.g., phase 5) may begin where V_Node 1 may be isolated from the memory cell 105-*b* based on establishing V_Node 1 indicative of the logic state stored on the memory cell 105-*b*. During the fifth phase 660, T1 may be deactivated using the 1casc signal applied to the gate of T1.

At time t6, the sixth phase 670 (e.g., phase 6) may begin where the sense component 125-*b* may sample the signal at Node 1. At time t6, V_ISO (e.g., voltage applied to a gate of T6) may rise to V$_{DD1}$ to activate T6. As a result of activating T6, Node 1 may be coupled with a signal node of the sense component 125-*b* such that V_G may develop at the signal node. In some cases, two different levels of V_G may be established at the signal node, which correspond to two different levels of V_Node 1 based on the logic state stored on the memory cell 105-*b*. A reference voltage level (e.g., V$_{DD}$) may be determined to be within the two different levels of V_G.

At time t7, the seventh phase 680 (e.g., phase 7) may begin where latching system of the sense component 125-*b* compares and amplifies the difference between V_G and the reference voltage (e.g., V$_{DD}$) to determine the logic state stored on the memory cell 105-*b*. At the end of seventh phase 680, V_G may reach either VDD2 (e.g., an operation voltage of the sense component 125-*b*) or Vss (e.g., virtual ground) based on the logic state stored on the memory cell 105-*b*.

As discussed above, during the third phase 640 and the fourth phase 650, the capacitance associated with Node 1 may be non-linear due to the difference in capacitance values of Cint 440 and Cpar 450 that may be operative during the first portion and the second portion of the read operation, respectively. As a result, V_Node 1 may exhibit a non-linear behavior even when a constant Io may be considered (e.g., the current Io flowing through T1 and T2 toward the memory cell 105-*b*) to provide a large sense window during a read operation as described with reference to FIG. 5. Consequently, the voltage difference in V_G during the sixth phase 670 (e.g., a sense window for the sense component 125-*b* to determine the logic state stored on the memory cell 105-*b*) may be greater than other sense windows generated without taking advantage of the non-linear capacitance behavior associated with Node 1 (e.g., non-linear behavior of V_Node 1) during a read operation.

Figure 7:
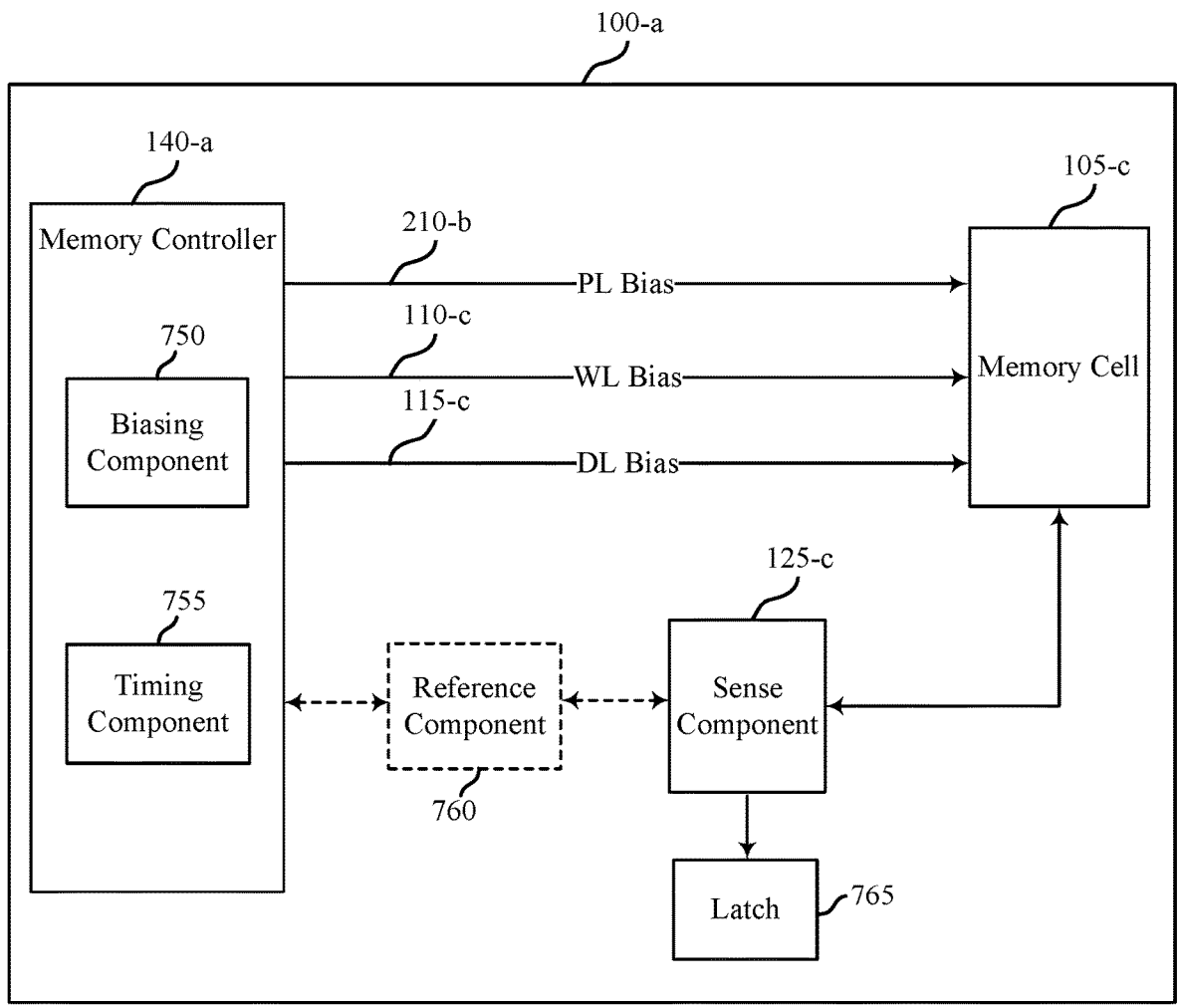
FIGS. 7 through 8 show block diagrams of a device that supports sensing a memory cell in accordance with aspects of the present disclosure.

FIG. 7 shows a block diagram 700 of a memory device that supports sensing a memory cell in accordance with aspects of the present disclosure. Memory array 100-*a* may be referred to as an electronic memory apparatus and includes memory controller 140-*a* and memory cell 105-*c*, which may be examples of memory controller 140 and memory cell 105 described with reference to FIG. 1. Memory controller 140-*a* may include a biasing component 750 and a timing component 755, and may operate the memory array 100-*a* as described with reference to FIG. 1. Memory controller 140-*a* may be in electronic communication with word line 110-*c*, digit line 115-*c*, plate line 210-*b*, and sense component 125-*c*, which may be examples of word line 110, digit line 115, plate line 210, and sense component 125 described with reference to FIGS. 1 through 4. Memory array 100-*a* may also include a reference component 760 and a latch 765. The components of the memory array 100-*a* may be in electronic communication with each other and may perform the functions described with reference to FIGS. 1 through 6. In some cases, the reference component 760, the sense component 125-*c*, and the latch 765 may be components of memory controller 140-*a*.

Memory controller 140-*a* may be configured to activate word line 110-*c*, plate line 210-*b*, or digit line 115-*c* by applying voltages to those various nodes. For example, the biasing component 750 may be configured to apply a voltage to operate the memory cell 105-*b* to read or write memory cell 105-*b* as described above. In some cases, memory controller 140-*a* may include a row decoder, column decoder, or both, as described with reference to FIG. 1. This may enable the memory controller 140-*a* to access one or more memory cells 105. The biasing component 750 may also provide voltage potentials to the reference component 760 in order to generate a reference signal for sense component 125-*c*. Additionally, the biasing component 750 may provide voltage potentials for the operation of the sense component 125-*c*.

In some cases, the memory controller 140-*a* may control various phases of a read operation. In some cases, the memory controller 140-*a* may precharge the digit line 115-*c* to a first voltage during a read operation. In some cases, the memory controller 140-*a* may precharge a capacitor to a second voltage, where the capacitor may be configured to integrate a charge associated with a memory cell during the read operation. In some cases, the memory controller 140-*a* may transfer the charge between the memory cell and the capacitor through a first cascode and a second cascode during the read operation, where the first cascode may be coupled with the memory cell and a sense component, and the second cascode may be coupled with the capacitor and the sense component. In some cases, the memory controller 140-*a* may determine a logic state stored on the memory cell based at least in part on transferring the charge through the first cascode and the second cascode.

In some cases, the memory controller 140-*a* may perform its operations using the timing component 755. For example, the timing component 755 may control the timing of the various word line selections, digit line selections, or plate line biasing, including timing for switching and voltage application to perform the memory functions, such as reading and writing, discussed herein. In some cases, the timing component 755 may control the operations of the biasing component 750.

In some cases, the memory array 100-*a* may include the reference component 760. The reference component 760 may include various components to generate a reference signal for the sense component 125-*c*. The reference component 760 may include circuitry configured to produce reference signals. In some cases, the reference component 760 may include other memory cells 105. In some examples, the reference component 760 may be configured to output a voltage with a value between the two sense voltages, as described with reference to FIG. 3. Or the reference component 760 may be designed to output a virtual ground voltage (i.e., approximately 0V).

The sense component 125-*c* may compare a signal from memory cell 105-*c* (through digit line 115-*c*) with a reference signal from the reference component 760. Upon determining the logic state, the sense component may then store the output in the latch 765, where it may be used in accordance with the operations of an electronic device that memory array 100-*a* is a part of. In some cases, a switching component (e.g., T6 described with reference to FIG. 4) may couple the sense component 125-*b* with a first node (e.g., Node 1 described with reference to FIG. 4), and the switching component may be configured to selectively couple the first node with the sense component during the read operation.

In some cases, the memory device, which may be referred to as an electronic memory device, may include a memory array including a memory cell coupled with a digit line and a controller coupled with the memory array and with a capacitor configured to integrate a charge associated with the memory cell during a read operation. In some cases, the controller may be configured to precharge the digit line to a first voltage, precharge the capacitor to a second voltage, transfer the charge between the memory cell and the capacitor through a first cascode and a second cascode during the read operation, the first cascode being coupled with the memory cell and a sense component, and the second cascode being coupled with the capacitor and the sense component, and determine a logic state stored on the memory cell based at least in part on transferring the charge through the first cascode and the second cascode.

Figure 8:
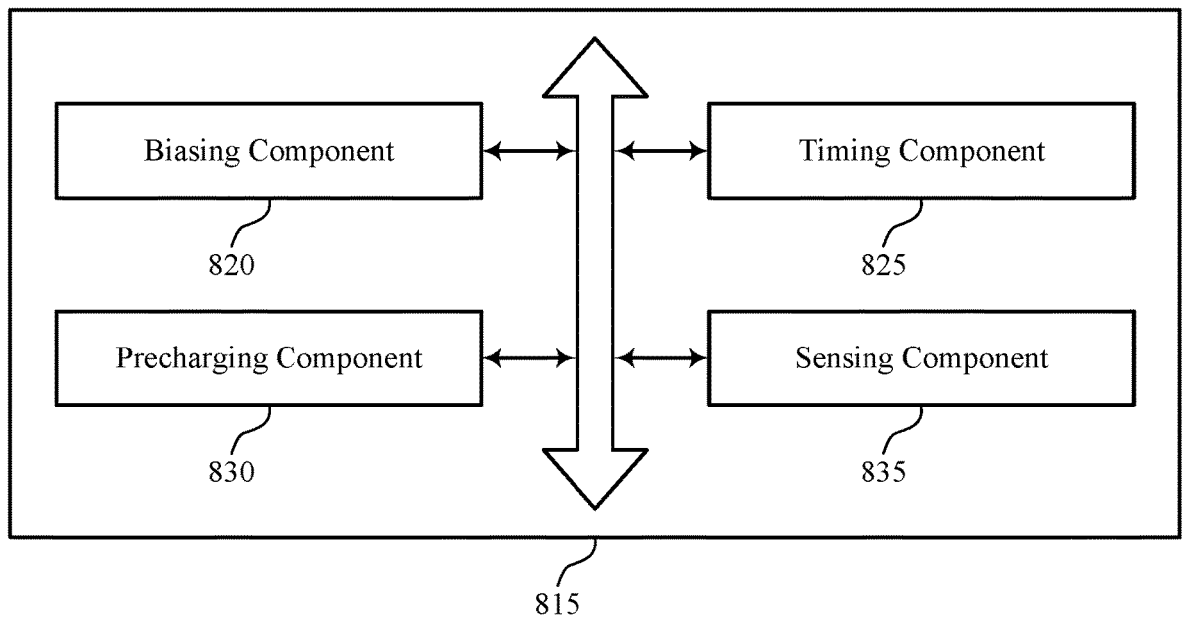

FIG. 8 shows a block diagram 800 of a memory controller 815 that supports sensing a memory cell in accordance with aspects of the present disclosure. The memory controller 815 may be an example of aspects of the memory controller 140 described with reference to FIGS. 1 and 7. The memory controller 815 may include a biasing component 820, a timing component 825, a precharging component 830, and a sensing component 835. Each of these modules may communicate, directly or indirectly, with one another (e.g., via one or more buses).

The biasing component 820 may couple the memory cell to the digit line that has been charged to the first voltage. In some cases, the biasing component 820 may compare the voltage at the first node and a reference voltage associated with the sense component based on activating the second switching component, where determining the logic state stored on the memory cell is based on comparing the voltage at the first node and the reference voltage. In some cases, the biasing component 820 may isolate the capacitor from the memory cell by deactivating the second cascode based on transferring the charge between the memory cell and the capacitor through the first cascode and the second cascode. In some cases, the biasing component 820 may deactivate the second cascode is based on a voltage across the capacitor being reduced during the read operation.

In some cases, the biasing component 820 may supply the charge from the capacitor to the memory cell through the first cascode and the second cascode based on coupling the memory cell to the digit line, where transferring the charge between the memory cell and the capacitor is based on supplying the charge. In some cases, the biasing component 820 may couple the memory cell to a first node through the first cascode based on biasing the word line, where the first node is configured to couple with the sense component. In some cases, the biasing component 820 may establish a voltage that is indicative of the logic state stored on the memory cell at the first node based on coupling the memory cell to the first node. In some cases, the biasing component 820 may deactivate the first cascode based on establishing the voltage at the first node.

In some cases, the biasing component 820 may activate a second switching component positioned between the first node and the sense component to couple the first node with the sense component during the read operation based on deactivating the first cascode. In some cases, the biasing component 820 may bias a word line associated with the memory cell to couple the memory cell with the digit line based on precharging the digit line to the first voltage. In some cases, the charge supplied from the capacitor through the first cascode and the second cascode is associated with the memory cell storing a first logic state, the charge being less than a second charge associated with the memory cell storing a second logic state.

The precharging component 830 may precharge a digit line to a first voltage and precharge a capacitor to a second voltage, the capacitor being configured to integrate a charge associated with a memory cell during a read operation.

The sensing component 835 may transfer the charge between the memory cell and the capacitor through a first cascode and a second cascode during the read operation, the first cascode being coupled with the memory cell and a sense component, and the second cascode being coupled with the capacitor and the sense component. In some cases, the sensing component 835 may determine a logic state stored on the memory cell based on transferring the charge through the first cascode and the second cascode. In some cases, the sensing component 835 may transfer an additional charge from a first node to the memory cell based on transferring the charge between the memory cell and the capacitor through the first cascode and the second cascode.

Figure 9:
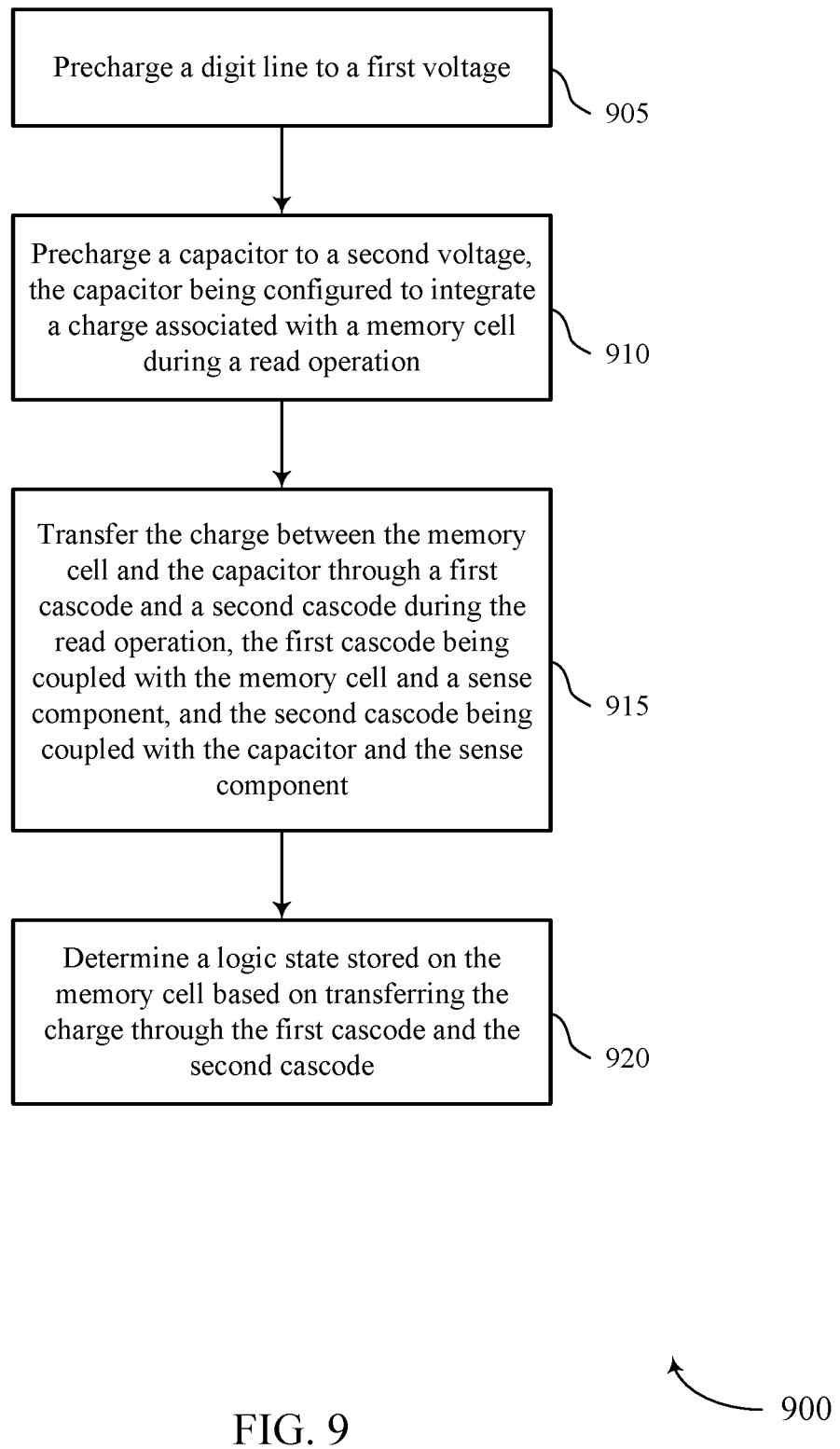
FIG. 9 illustrates a method for sensing a memory cell in accordance with aspects of the present disclosure.

FIG. 9 shows a flowchart illustrating a method 900 for sensing a memory cell in accordance with aspects of the present disclosure. The operations of method 900 may be implemented by a memory array 100 or its components as described herein. For example, the operations of method 900 may be performed by a memory controller as described with reference to FIGS. 1, 7, and 8. In some examples, a memory array 100 may execute a set of codes to control the functional elements of the device to perform the functions described below. Additionally or alternatively, the memory array 100 may perform aspects of the functions described below using special-purpose hardware.

At 905 the memory array 100 may precharge a digit line to a first voltage. The operations of 905 may be performed according to the methods described herein. In certain examples, aspects of the operations of 905 may be performed by a precharging component as described with reference to FIGS. 4 through 8.

At 910 the memory array 100 may precharge a capacitor to a second voltage, the capacitor being configured to integrate a charge associated with a memory cell during a read operation. The operations of 910 may be performed according to the methods described herein. In certain examples, aspects of the operations of 910 may be performed by a precharging component as described with reference to FIGS. 4 through 8.

At 915 the memory array 100 may transfer the charge between the memory cell and the capacitor through a first cascode and a second cascode during the read operation, the first cascode being coupled with the memory cell and a sense component, and the second cascode being coupled with the capacitor and the sense component. The operations of 915 may be performed according to the methods described herein. In certain examples, aspects of the operations of 915 may be performed by a sensing component as described with reference to FIGS. 4 through 8.

At 920 the memory array 100 may determine a logic state stored on the memory cell based at least in part on transferring the charge through the first cascode and the second cascode. The operations of 920 may be performed according to the methods described herein. In certain examples, aspects of the operations of 920 may be performed by a sensing component as described with reference to FIGS. 4 through 8.

An apparatus for performing the method 900 is described. The apparatus may include means for precharging a digit line to a first voltage, means for precharging a capacitor to a second voltage, the capacitor being configured to integrate a charge associated with a memory cell during a read operation, means for transferring the charge between the memory cell and the capacitor through a first cascode and a second cascode during the read operation, the first cascode being coupled with the memory cell and a sense component, and the second cascode being coupled with the capacitor and the sense component, and means for determining a logic state stored on the memory cell based at least in part on transferring the charge through the first cascode and the second cascode.

Another apparatus for performing the method 900 is described. The apparatus may include a memory cell and a memory controller in electronic communication with the memory cell, wherein the memory cell is operable to precharge a digit line to a first voltage, precharge a capacitor to a second voltage, the capacitor being configured to integrate a charge associated with a memory cell during a read operation, transfer the charge between the memory cell and the capacitor through a first cascode and a second cascode during the read operation, the first cascode being coupled with the memory cell and a sense component, and the second cascode being coupled with the capacitor and the sense component, and determine a logic state stored on the memory cell based at least in part on transferring the charge through the first cascode and the second cascode.

Some examples of the method 900 and apparatus described above may further include processes, features, means, or instructions for coupling the memory cell to the digit line that may have been charged to the first voltage. Some examples of the method 900 and apparatus described above may further include processes, features, means, or instructions for supplying the charge from the capacitor to the memory cell through the first cascode and the second cascode based at least in part on coupling the memory cell to the digit line, wherein transferring the charge between the memory cell and the capacitor may be based at least in part on supplying the charge.

In some examples of the method 900 and apparatus described above, the charge supplied from the capacitor through the first cascode and the second cascode may be associated with the memory cell storing a first logic state, the charge being less than a second charge associated with the memory cell storing a second logic state.

Some examples of the method 900 and apparatus described above may further include processes, features, means, or instructions for isolating the capacitor from the memory cell by deactivating the second cascode based at least in part on transferring the charge between the memory cell and the capacitor through the first cascode and the second cascode.

Some examples of the method 900 and apparatus described above may further include processes, features, means, or instructions for deactivating the second cascode may be based at least in part on a voltage across the capacitor being reduced during the read operation.

Some examples of the method 900 and apparatus described above may further include processes, features, means, or instructions for transferring an additional charge from a first node to the memory cell based at least in part on transferring the charge between the memory cell and the capacitor through the first cascode and the second cascode.

Some examples of the method 900 and apparatus described above may further include processes, features, means, or instructions for biasing a word line associated with the memory cell to couple the memory cell with the digit line based at least in part on precharging the digit line to the first voltage.

Some examples of the method 900 and apparatus described above may further include processes, features, means, or instructions for coupling the memory cell to a first node through the first cascode based at least in part on biasing the word line, wherein the first node may be configured to couple with the sense component. Some examples of the method 900 and apparatus described above may further include processes, features, means, or instructions for establishing a voltage that may be indicative of the logic state stored on the memory cell at the first node based at least in part on coupling the memory cell to the first node.

Some examples of the method 900 and apparatus described above may further include processes, features, means, or instructions for deactivating the first cascode based at least in part on establishing the voltage at the first node. Some examples of the method 900 and apparatus described above may further include processes, features, means, or instructions for activating a second switching component positioned between the first node and the sense component to couple the first node with the sense component during the read operation based at least in part on deactivating the first cascode.

Some examples of the method 900 and apparatus described above may further include processes, features, means, or instructions for comparing the voltage at the first node and a reference voltage associated with the sense component based at least in part on activating the second switching component, wherein determining the logic state stored on the memory cell may be based at least in part on comparing the voltage at the first node and the reference voltage.

It should be noted that the methods described above describe possible implementations, and that the operations and the steps may be rearranged or otherwise modified and that other implementations are possible. Furthermore, features from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

As used herein, the term "substantially" means that the modified characteristic (e.g., a verb or adjective modified by the term substantially) need not be absolute but is close enough so as to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array 100.

The term "isolated" refers to a relationship between components in which electrons are not presently capable of flowing between them; components are isolated from each other if there is an open circuit between them. For example, two components physically connected by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the flow of charge between components (or lines) that are in electronic communication.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A device, comprising:
   a memory cell configured to store a logic state;
   a capacitor configured to integrate a charge associated with the memory cell during a read operation;
   a sense component configured to determine the logic state stored on the memory cell during the read operation;
   a first cascode coupled with the memory cell and a first node;
   a second cascode coupled with the capacitor and the first node, wherein the second cascode is configured to isolate the first node from the capacitor based at least in part on a voltage of a digit line failing to satisfy a threshold; and
   a transistor coupled with the first node and the sense component and configured to selectively couple the first node with the sense component during the read operation after the capacitor is isolated from the first node.

2. The device of claim 1, wherein the second cascode is configured to enable a sense window during the read operation based at least in part on the second cascode being coupled with the capacitor and the sense component.

3. The device of claim 1, further comprising:
   a second transistor coupled with the capacitor and a second node of the second cascode, the second transistor is configured to precharge the capacitor to a first voltage during the read operation.

4. The device of claim 1, wherein the second cascode is configured to isolate the capacitor from the memory cell after transferring at least a portion of the charge to the memory cell during the read operation.

5. The device of claim 1, further comprising:
   a second capacitor coupled with the first node, wherein the second capacitor is configured to transfer an additional charge to the memory cell after the capacitor is isolated from the memory cell.

6. The device of claim 5, wherein the second capacitor comprises a parasitic capacitance at the first node.

7. The device of claim 5, wherein at least the first node or the capacitor is configured to discharge a first voltage with a first rate of change during a first portion of the read operation.

8. The device of claim 7, wherein at least the first node or the second capacitor is configured to discharge a second voltage with a second rate of change during a second portion of the read operation when the memory cell stores a first logic state, wherein the second rate of change is greater than the first rate of change.

9. The device of claim 8, wherein the first rate of change and the second rate of change configure a sense window during the read operation.

10. The device of claim 1, wherein the memory cell is configured to receive, when the memory cell stores a first logic state, a first amount of charge during the read operation that is greater than a second amount of charge received when the memory cell stores a second logic state.

11. The device of claim 1, wherein:
the first cascode comprises an n-type metal oxide semiconductor (NMOS) field effect transistor (FET) and the second cascode comprises a p-type metal oxide semiconductor (PMOS) field effect transistors (FET).

12. The device of claim 1, wherein a value of a voltage source applied to a gate of the second cascode and a threshold voltage of the second cascode are configured to deactivate the second cascode when the charge has been transferred from the capacitor to the memory cell during the read operation.

13. A method, comprising:
precharging a digit line to a first voltage;
precharging a capacitor to a second voltage, the capacitor being configured to integrate a charge associated with a memory cell during a read operation;
transferring the charge between the memory cell and the capacitor through a first cascode and a second cascode during the read operation, the first cascode being coupled with the memory cell and a first node associated with a sense component, and the second cascode being coupled with the capacitor and the first node;
isolating the first node from the capacitor based at least in part on transferring the charge and on a voltage of the digit line failing to satisfy a threshold;
coupling, using a transistor, the first node with the sense component after isolating the first node from the capacitor; and
determining a logic state stored on the memory cell based at least in part on coupling the first node with the sense component.

14. The method of claim 13, further comprising:
coupling the memory cell to the digit line that has been charged to the first voltage; and
supplying the charge from the capacitor to the memory cell through the first cascode and the second cascode based at least in part on coupling the memory cell to the digit line, wherein transferring the charge between the memory cell and the capacitor is based at least in part on supplying the charge.

15. The method of claim 14, wherein the charge supplied from the capacitor through the first cascode and the second cascode is associated with the memory cell storing a first logic state, the charge being less than a second charge associated with the memory cell storing a second logic state.

16. The method of claim 13, further comprising:
isolating the capacitor from the memory cell by deactivating the second cascode based at least in part on transferring the charge between the memory cell and the capacitor through the first cascode and the second cascode.

17. The method of claim 16, wherein deactivating the second cascode is based at least in part on a voltage across the capacitor being reduced during the read operation.

18. The method of claim 13, further comprising:
transferring an additional charge from the first node to the memory cell based at least in part on transferring the charge between the memory cell and the capacitor through the first cascode and the second cascode.

19. The method of claim 13, further comprising:
biasing a word line associated with the memory cell to couple the memory cell with the digit line based at least in part on precharging the digit line to the first voltage.

20. The method of claim 19, further comprising:
coupling the memory cell to the first node through the first cascode based at least in part on biasing the word line, wherein the first node is configured to couple with the sense component; and
establishing a voltage that is indicative of the logic state stored on the memory cell at the first node based at least in part on coupling the memory cell to the first node.

21. The method of claim 20, further comprising:
deactivating the second cascode to isolate the first node from the capacitor based at least in part on establishing the voltage at the first node; and
activating the transistor positioned between the first node and the sense component to couple the first node with the sense component during the read operation based at least in part on deactivating the first cascode.

22. The method of claim 21, further comprising:
comparing the voltage at the first node and a reference voltage associated with the sense component based at least in part on activating the transistor, wherein determining the logic state stored on the memory cell is based at least in part on comparing the voltage at the first node and the reference voltage.

23. A memory device, comprising:
a memory array comprising a memory cell coupled with a digit line;
a controller coupled with the memory array and with a capacitor configured to integrate a charge associated with the memory cell during a read operation, the controller configured to cause the memory device:
precharge the digit line to a first voltage;
precharge the capacitor to a second voltage;
transfer the charge between the memory cell and the capacitor through a first cascode and a second cascode during the read operation, the first cascode being coupled with the memory cell and a first node associated with a sense component, and the second cascode being coupled with the capacitor and the first node;
isolate the first node from the capacitor based at least in part on transferring the charge and on a voltage of the digit line failing to satisfy a threshold;
couple, using a transistor, the first node with the sense component after isolating the first node from the capacitor; and
determine a logic state stored on the memory cell based at least in part on coupling the first node with the sense component.

* * * * *